(12) United States Patent
Ishida

(10) Patent No.: US 7,656,084 B2
(45) Date of Patent: Feb. 2, 2010

(54) METHOD OF PRODUCING LAMINATED TYPE ORGANIC ELECTROLUMINESCENT ELEMENT AND DISPLAY APPARATUS

(75) Inventor: Kohei Ishida, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 520 days.

(21) Appl. No.: 11/068,420

(22) Filed: Mar. 1, 2005

(65) Prior Publication Data

US 2005/0196526 A1    Sep. 8, 2005

(30) Foreign Application Priority Data

Mar. 3, 2004    (JP)    ............................ 2004-059307

(51) Int. Cl.
*H05B 33/10*    (2006.01)
*H05B 33/12*    (2006.01)

(52) U.S. Cl. ........................ 313/504; 313/505; 313/506; 445/22

(58) Field of Classification Search ......... 313/504–512; 315/169.3, 169.4; 257/40, 79; 428/690; 345/30, 36, 44, 45; 445/22–25

See application file for complete search history.

(56) References Cited

U.S. PATENT DOCUMENTS

| | | | |
|---|---|---|---|
| 6,107,734 | A | 8/2000 | Tanaka et al. |
| 6,852,994 | B2 | 2/2005 | Seki et al. |
| 2002/0109456 | A1* | 8/2002 | Morii et al. ................. 313/504 |
| 2003/0189401 | A1* | 10/2003 | Kido et al. ................... 313/504 |
| 2004/0160170 | A1* | 8/2004 | Sato et al. ................... 313/504 |

FOREIGN PATENT DOCUMENTS

| | | |
|---|---|---|
| JP | 63-070257 A | 3/1988 |
| JP | 63-175860 A | 7/1988 |
| JP | 02-135359 A | 5/1990 |
| JP | 02-135361 A | 5/1990 |
| JP | 03-152184 A | 6/1991 |
| JP | 06-025659 A | 2/1994 |
| JP | 06-203963 A | 7/1994 |
| JP | 06-215874 A | 8/1994 |
| JP | 07-097355 A | 4/1995 |

(Continued)

OTHER PUBLICATIONS

Junji Kubo, An approch to the "High Efficiency", Yuuki No Subete [All About Organic EL], Feb. 2003, 205-207, Nippon Jitsugyo Publishing Co., Ltd., Japan.

*Primary Examiner*—Joseph L Williams
*Assistant Examiner*—Elmito Breval
(74) *Attorney, Agent, or Firm*—Global IP Counselors, LLP

(57) ABSTRACT

A method of manufacturing includes providing one of the anode and the cathode, providing a layer of bank portions on the cathode or the anode, the bank portions defining apertures, providing the light emitting units in the apertures, providing the charge-generating portions over the light emitting units, at least one of the charge-generating layers being formed using a depositing device, and providing the other of the anode and the cathode. A display apparatus has a laminated organic electroluminescent element obtained with the manufacturing method. The manufacturing method provides with a high production efficiency an organic EL element having between a cathode and an opposing transparent anode at least one layer of a plurality of light-emitting units partitioned by at least one layer of charge-generating layers.

14 Claims, 8 Drawing Sheets

FOREIGN PATENT DOCUMENTS

| | | |
|---|---|---|
| JP | 07-101911 A | 4/1995 |
| JP | 07-126225 A | 5/1995 |
| JP | 07-126226 A | 5/1995 |
| JP | 07-145116 A | 6/1995 |
| JP | 07-157473 A | 6/1995 |
| JP | 07-188130 A | 7/1995 |
| JP | 07-224012 A | 8/1995 |
| JP | 08-040995 A | 2/1996 |
| JP | 08-040996 A | 2/1996 |
| JP | 08-040997 A | 2/1996 |
| JP | 08-048656 A | 2/1996 |
| JP | 10-270171 A | 10/1998 |
| JP | 11-233262 A | 8/1999 |
| JP | 11-329748 A | 11/1999 |
| JP | 2000-182774 A | 6/2000 |
| JP | 2001-102175 A | 4/2001 |
| JP | 2002-231447 A | 8/2002 |
| JP | 2002-332567 A | 11/2002 |
| JP | 2003-045676 A | 2/2003 |
| JP | 2003-272860 A | 9/2003 |
| KR | 10-2004-0014353 | 2/2004 |
| WO | WO-01/74121 A1 | 10/2001 |

\* cited by examiner

METHOD OF PRODUCING LAMINATED TYPE ORGANIC ELECTROLUMINESCENT ELEMENT AND DISPLAY APPARATUS

BACKGROUND OF THE INVENTION

Field of the Invention

The present invention relates to a method of producing an organic electroluminescent element (hereinafter referred to as "organic EL element") used in flat surface light sources and display elements. More particularly, the present invention relates to a method of producing a laminated type organic EL element having between a cathode and an opposing transparent anode at least one light-emitting layer and a plurality of light-emitting units that is partitioned by at least one layer of a charge-generating layer. The present invention further relates to a display apparatus having a laminated type organic electroluminescent element obtained with such production method.

Organic EL elements having a light-emitting layer composed of an organic compound disposed between a cathode and an opposing anode have been receiving attention in recent years as large surface area display elements that can be driven with low voltage (See JUNJI KIDO, YUUKI EL NO SUBETE [ALL ABOUT ORGANIC EL] 205-207 (Nippon Jitsugyo Publishing Co., Ltd. 2003), for example). From the aspect of the length of service life of elements, however, conventional organic EL elements have only recently achieved a half-life exceeding 10,000 hours at an intensity of about 100 cd/m$^2$, which is a level required in display applications. It remains difficult at the present stage to obtain sufficient service life at the intensity of about 1,000 cd/m$^2$ to about 10,000 cd/m$^2$, which is the intensity required in various actual illumination applications.

Proposed in Japanese Patent Application Publication No. 2003-45676 to solve this problem is an organic EL element which has a plurality of light-emitting units between a cathode and an opposing anode, each of the plurality of light-emitting units having a layer that has an equipotential surface and is composed of a transparent electrode material whose transmittance of visible light is 50% or higher.

However, when a substance with high conductivity (high electrical resistivity) is used to partition the plurality of light-emitting units, there are cases in which it is difficult to define the light-emitting areas as desired because of the conductivity in the surface direction (direction parallel to the substrate). Also, the manufacturing method cited in this patent application publication proves difficult to implement.

Proposed in Japanese Patent Application Publication No. 2003-272860 is an organic EL element having at least one layer of light-emitting units between a cathode and an opposing anode, wherein the light-emitting units are partitioned by at least one charge-generating layer, and the charge-generating layer is an electrical insulation layer having an electrical resistivity of $1.0 \times 10^2$ Ω·cm or higher. With the organic EL element cited therein, only the plurality of light-emitting units that are in areas in which the cathode and the anode intersect simultaneously illuminate (as if the units are connected in series) when a predetermined voltage is applied to both electrodes. This makes it possible to achieve a high quantum efficiency (or current efficiency) that was not possible with a conventional organic EL element.

However, the charge-generating layer of the organic EL element cited in this patent application publication is formed with resistive-heating vapor deposition, electron beam vaporization, laser beam vaporization, sputtering, or another method. Such methods are problematic in that the productivity is poor.

There is therefore a need for the development of a method in which a film is formed simply and with a precise patterning without wasting organic material that constitutes the charge-generating layer.

In view of the above, it will be apparent to those skilled in the art from this disclosure that there exists a need for an improved method of manufacturing laminated type organic EL elements that overcome the problems of the conventional art This invention addresses this need in the art as well as other needs, which will become apparent to those skilled in the art from this disclosure.

SUMMARY OF THE INVENTION

An object of the present invention is to provide a method of manufacturing with high productivity a laminated type organic EL element having at least one layer of light-emitting units between a cathode and an opposing anode, the light-emitting units being partitioned by at least one layer of charge-generating layer.

According to the present invention, it is possible to manufacture with high productivity a high quality laminated type organic EL element having at least one layer of light-emitting units between a cathode and an opposing anode, wherein the light-emitting layers are partitioned by at least one layer of charge-generating portions.

According to the second aspect of the present invention, a display apparatus having the laminated type organic electroluminescent element obtained with the manufacturing method of the present invention is provided.

These and other objects, features, aspects and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Figure 1:
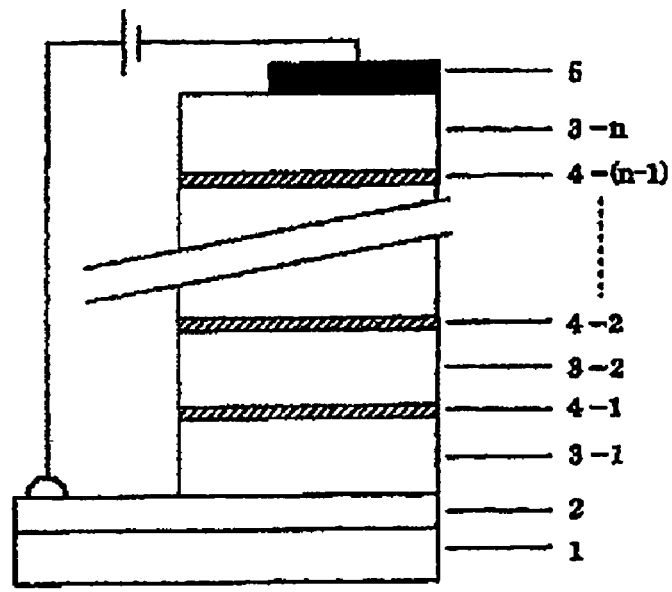
FIG. 1 is a cross-sectional view of the layered structure of a laminated organic EL element manufactured with a manufacturing method in accordance with an embodiment of the present invention.

As a result of thoroughgoing research to solve the above-described problems, the present inventors have discovered that it is possible to manufacture with high productivity a laminated type organic EL element having excellent performance characteristics when at least one of the charge-generating layers is formed using a deposit device at the time of manufacturing a laminated type organic EL element that has at least one layer of light-emitting units between a cathode and an opposing anode, the light-emitting units being partitioned by at least one charge-generating layer.

Thus, a method of manufacturing a laminated type organic electroluminescent element in accordance with the first aspect of the present invention, is cited in (1) to (12) below.

(1) A method of manufacturing a laminated type organic electroluminescent element having between a cathode and an opposing transparent anode at least one layer of a plurality of light-emitting units partitioned by at least one layer of charge-generating portions. The manufacturing method includes steps of providing one of the cathode and the anode; providing a layer of bank portions on the one of the cathode and the anode, the bank portions defining apertures; providing the light emitting units in the apertures; providing the charge-generating portions over the light emitting units, at least one of the charge-generating portions being formed using a depositing device; and providing the other of the anode and the cathode.

(2) The method of manufacturing a laminated type organic electroluminescent element is the method of (1), wherein the layer of the charge-generating portions has an electrical resistivity of $1.0 \times 10^2$ Ω·cm or higher.

(3) The method of manufacturing a laminated type organic electroluminescent element is the method of (1) or (2), wherein the layer of the charge-generating portions has a transmittance rate of visible light that is 50% or higher.

(4) The method of manufacturing a laminated type organic electroluminescent element is the method of any of (1) to (3), wherein the layer of the charge-generating portions includes a laminated or mixed layer of two different types of substances with a charge-transfer complex composed of a radical cation and a radical anion being produced by an oxidation-reduction reaction between the two types of substances.

(5) The method of manufacturing a laminated type organic electroluminescent element is the method of any of (1) to (4), wherein the layer of the charge-generating portions includes a laminated or mixed layer of a component (a) an organic compound having an ionization potential that is smaller than 5.7 eV and electron-donating characteristics, and a component (b) at least one of an inorganic compound and an organic compound, the component (b) being capable of forming a change-transfer complex by an oxidation-reduction reaction with the organic compound (a), with a charge-transfer complex being formed by an oxidation-reduction reaction between the component (a) and the component (b).

(6) The method of manufacturing a laminated type organic electroluminescent element is the method according to claim 5, wherein the component (a) is an arylamine compound shown in the following formula (I):

wherein $Ar_1$, $Ar_2$, and $Ar_3$ are aromatic hydrocarbons. Each of $Ar_1$, $Ar_2$, and $Ar_3$ can independently have a substituent.

(7) The method of manufacturing a laminated type organic electroluminescent element is the method of (5) or (6), wherein the component (b) includes a metal oxide as an inorganic component.

(8) The method of manufacturing a laminated type organic electroluminescent element is the method of any of (5) to (7), wherein the component (b) includes a metal halide as an inorganic component.

(9) The method of manufacturing a laminated type organic electroluminescent element is the method of any of (5) to (8), wherein the component (b) has an organic compound that has at least one fluorine atom as a substituent and an electron-accepting characteristic.

(10) The method of manufacturing a laminated type organic electroluminescent element is the method of any of (5) to (9), wherein the component (b) has an organic compound that has at least one cyano group as a substituent and an electron-accepting characteristic.

(11) The method of manufacturing a laminated type organic electroluminescent element is the method of any of (1) to (10), wherein the light-emitting units are formed using a depositing device.

(12) The method of manufacturing a laminated type organic electroluminescent element is the method of any of (1) to (11), wherein each of the light-emitting units includes a hole injection/transport layer and a light-emitting layer, and at least one of the hole injection/transport layers and the light-emitting layers are formed using a depositing device.

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

Described in detail hereinbelow are the method for producing a laminated type organic EL element and the display apparatus in accordance with the present invention.

1) Method Of Manufacturing A Laminated Type Organic El Element

The method of manufacturing a laminated type organic EL element according to the present invention is a method of manufacturing a laminated type organic electroluminescent element having between a cathode and an opposing transparent anode at least one layer of a plurality of light-emitting units partitioned by at least one layer of charge-generating portions, wherein at least one of the charge-generating portions is formed using a deposit device.

In the present invention, the term "light-emitting unit" refers to a constituent element having a layered structure that includes at least one light-emitting layer excluding the anode and cathode of the constituent elements of a conventional organic EL element. For example, such light-emitting unit can be (anode)/light-emitting layer/(cathode), (anode)/hole injection/transport layer/light-emitting layer/(cathode), or other units having transport characteristics.

Also, the term "charge-generating layer" refers to a layer that serves to inject holes in the cathode direction of the element and to inject electrons in the anode direction when a voltage is applied. Such charge-generating layer is an electrically insulating layer having an electrical resistivity that is preferably $1.0 \times 10^2$ Ω·cm or higher, and is more preferably $1.0 \times 10^5$ Ω·cm or higher.

Shown in FIG. 1 is a structural cross section of an example of a laminated type organic EL element manufactured in accordance with the manufacturing method of the present invention. The laminated type organic EL element shown in FIG. 1 is formed between an anode 2 and a cathode 5 with n light-emitting units (3-1 to 3-n) partitioned by charge-generating layers (4-1 to 4-(n-1)). Hereinafter, "n" represents a natural number. In other words, stacked on a glass substrate (transparent substrate) 1 are a transparent anode 2 constituting an anode, a light-emitting unit 3-1, a charge-generating layer 4-1, a light-emitting unit 3-2, a charge-generating layer 4-2, ..., a charge-generating layer 4-(n-1), a light-emitting unit 3-n, and a cathode 5. Of these, the glass substrate (transparent substrate) 1, the transparent anode 2, the light-emitting unit (3-n), and the cathode 5 are found in a conventional organic EL element. In the organic EL element in accordance with the present invention, a plurality of light-emitting units (3-n) is partitioned by charge-generating layers (4-n) between the electrodes.

The method of producing a laminated type organic EL element of the present invention is described in detail below with reference to the example of a laminated type organic EL element shown in FIG. 1 and to the example of a two-layer laminated type organic EL element shown as a schematic diagram in FIG. 2.

Figure 2:
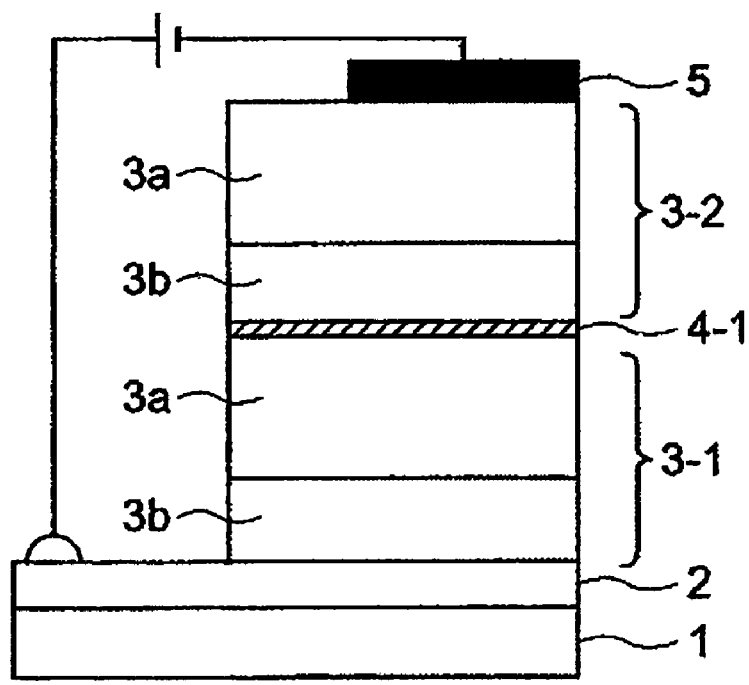
FIG. 2 is a cross-sectional view of the layered structure of a two-layer laminated organic EL element manufactured with the manufacturing method in accordance with an embodiment of the present invention.

The two-layer laminated type organic EL element shown in FIG. 2 is composed of, beginning from the lower side, a transparent substrate 1, an anode 2, a light-emitting unit 3-1, a charge-generating layer 4-1, a light-emitting unit 3-2, and a cathode 5. Also, the light-emitting unit 3-1 and 3-2 each have a two-layered structure composed of a hole injection/transport layer 3a and a light-emitting layer 3b. Of the above-described layered structures, one in which the light-emitting unit 3-1, charge-generating layer 4-1, and light-emitting unit 3-2 are formed using an depositing device is adopted in the present embodiment.

The depositing device used in the present embodiment can be one that deposits a deposit material with the inkjet method using a depositing head. Examples include a thermal depositing device that generates air bubbles by heat foaming to deposit droplets, and a piezo depositing device that deposits droplets with compression using a piezoelement.

Figure 3:
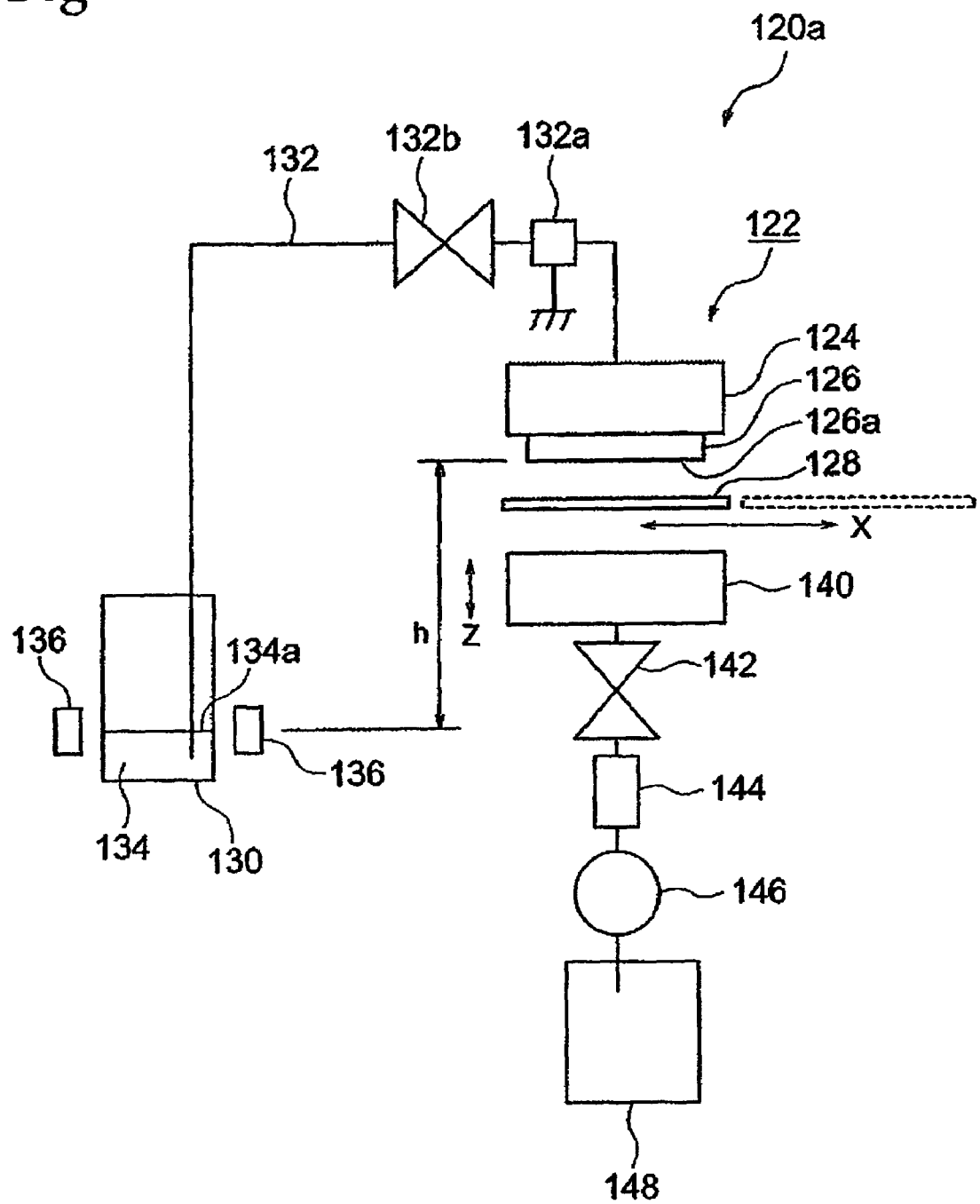
FIG. 3 is a schematic diagram of the inkjet depositing device to be used in the manufacturing methods according to the embodiment of the present invention.

An example of the depositing device used in the present embodiment is shown in FIG. 3. FIG. 3 is a schematic diagram of the configuration of the inkjet depositing device 120a used when manufacturing the organic EL element according to the embodiments of this invention. The depositing device 120a is provided with an inkjet head 122 for depositing a deposit material to a substrate. The inkjet head 122 is provided with a head main body 124 and a nozzle portion 126 in which a large number of nozzles are formed for depositing the deposit material. The deposit material, that is to say, a material for forming a hole injection/transport layer is deposited from the nozzles of the nozzle portion 126.

The depositing device 120a is provided with a table 128 on which a substrate is placed. The table 128 is disposed so as to be movable in predetermined directions, that is, the X-, Y-, and Z-axis directions, for example. Also, the table 128 is configured so as to move in the direction along the X-axis as indicated by an arrow in the diagram. The substrate on which the depositing is to be performed is transported by a belt conveyor (not shown) and placed on the table 128; and the table 128 is then drawn into the depositing device 120a.

A tank 130 for storing the material for forming a hole injection/transport layer, which is the deposit material to be deposited from the nozzles formed in the nozzle portion 126, is connected to the inkjet head 122 via deposit material transport tube 132. In other words, the tank 130 and inkjet head 122 are connected by way of the deposit material transport tube 132 for transporting the deposit material.

The deposit material transport tube 132 is provided with a head unit bubble-eliminating valve 132b and a deposit material flow channel ground coupling 132a for preventing static electricity in the flow channel of the deposit material transport tube 132. The head unit bubble-eliminating valve 132b is used while suctioning the deposit material in the inkjet head 122 with a suction cap 140 described below. In other words, while suctioning the deposit material in the inkjet head 122 with the suction cap 140, the head unit bubble-eliminating valve 132b is closed to prevent the deposit material from entering from the tank 130. When suctioning with the suction cap 140, the speed at which the deposit material is suctioned increases and the bubbles in the inkjet head 122 are quickly eliminated.

Also, the depositing device 120a is provided with a liquid level control sensor 136 for controlling the amount of deposit material stored in the tank 130, in other words the height of the liquid level 134a of the deposit material stored in the tank 130. The liquid level control sensor 136 keeps the height difference h (hereinafter referred to as "water head value") of the liquid level 134a in the tank 130 and the bottom surface 126a of the nozzle portion 126 in the inkjet head 122 within a predetermined range. The deposit material 134 in the tank 130 is fed to the inkjet head 122 with a pressure that falls within a predetermined range by controlling the height of the liquid level 134a. In this manner, the deposit material 134 can be stably deposited from the inkjet head 122 by feeding the deposit material 134 with a pressure that falls within a predetermined range.

A suction cap 140 for suctioning the deposit material in the nozzles of the inkjet head 122 is disposed opposite and at a fixed distance away from the nozzle portion 126 of the inkjet head 122.

The suction cap 140 is configured so as to be movable in the direction along the Z-axis as indicated by an arrow Z in FIG. 3. The suction cap 140 can come into close contact with the nozzle portion 126 so as to enclose the plurality of nozzles formed in the nozzle portion 126 by forming a sealed space between the nozzle portion 126 and the suction cap 140 to allow the nozzles to be isolated from the outside air.

The suctioning of the deposit material from the nozzles of the inkjet head 122 with the suction cap 140 is carried out when the inkjet head 122 is not depositing the deposit material 134, for example when the inkjet head 122 is moved to a withdrawn position and the table 128 is withdrawn to the position indicated by the broken line in FIG. 3.

A flow channel is disposed below the suction cap 140. Disposed in the flow channel are a suction valve 142, a suction pressure detection sensor 144 for detecting suction abnormalities, and a suction pump 146 composed of a tube pump or the like. Also, the deposit material 134 suctioned by the suction pump 146 or the like and transported through the flow channel is stored in a waste liquid tank 148.

It should be noted that in the present embodiment, a depositing device for depositing the material for forming a hole injection/transport layer, a depositing device for depositing the material for forming a light-emitting layer, and a depositing device for depositing the material for forming a charge-generating layer are used as depositing devices. These depositing devices have the same configuration as the depositing device 120a shown in FIG. 3, except that the deposit material is different.

Next, the method of manufacturing the two-layer laminated type organic EL element shown in FIG. 2 is described in detail with reference to the diagrams and the flowchart shown in FIG. 4.

Figure 4:
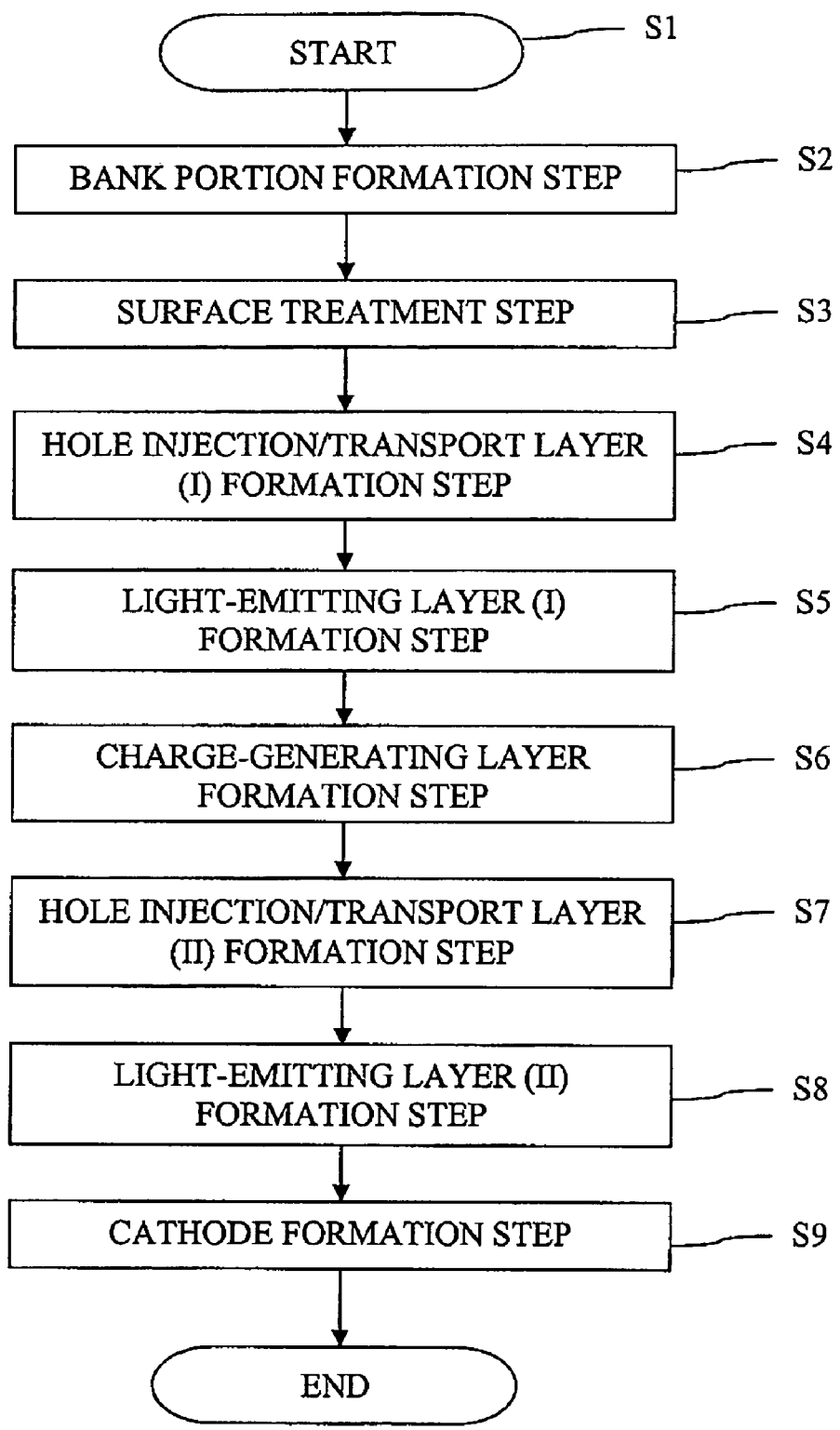
FIG. 4 is a flowchart of the method of manufacturing a laminated organic EL element according to the embodiment of the present invention.

The two-layer laminated type organic EL element shown in FIG. 2 is manufactured with the following steps: a bank portion formation step (S2), a surface treatment step (S3), a hole injection/transport layer (I) formation step (S4), a light-emitting layer (I) formation step (S5), a charge-generating layer formation step (S6), a hole injection/transport layer (II) formation step (S7), a light-emitting layer (II) formation step (S8), and a cathode formation step (S9), as shown in FIG. 4. It should be noted that the manufacturing steps of the present inventions are not limited to the one depicted in FIG. 4, and other steps may be added or removed as required.

Start (S1)

First, a substrate 10A that will be used in the bank unit formation step (S2) is prepared.

Figure 5:
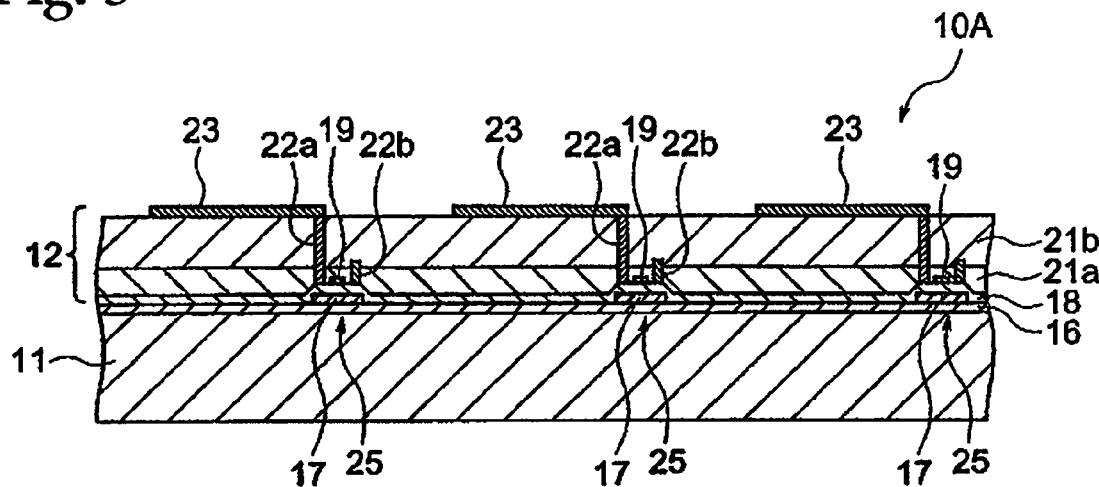
FIG. 5 is a cross-sectional view of the laminated organic EL element at a manufacturing step of the manufacturing method according to the embodiment of the present invention.

A cross-sectional view of the structure of the substrate 10A is shown in FIG. 5. In FIG. 5, the substrate 10A has a transparent base 11 and a circuit element portion 12. A subsurface protective layer 16 composed of a silicon oxide film is formed between the circuit element portion 12 and substrate 11, and separate semiconductor films 17 composed of polycrystalline silicon are formed on the subsurface protective layer 16. A source area and drain area are formed by high-density positive ion implantation in the areas to the left and right of the semiconductor films 17. The center area in which positive ions are not implanted is the channel area. It should be noted that in FIG. 5, the distinction between the source area, the drain area, and the channel area is omitted (and the same applies hereinafter).

A transparent gate insulation film 18 for covering the subsurface protective film 16 and the semiconductor film 17 is formed in the circuit element portion 12. Gate electrodes 19 that are composed of, for example, Al, Mo, Ta, Ti, or W, are formed in positions corresponding to the channel areas of the semiconductor films 17 on the gate insulation film 18. A transparent first interlayer insulation film 21a and a second interlayer insulation film 21b are formed on the gate electrodes 19 and the gate insulation film 18. Also, contact holes 22a and 22b are formed through the source and drain areas of the semiconductor films 17 and are made to pass completely through the first and second interlayer insulation films 21a and 21b.

A transparent anode 23 composed of ITO (indium-tin oxide) or the like is patterned and formed in a predetermined shape on the second interlayer insulation film 21b, and the anode 23 is connected to the source area by way of the contact hole 22a.

The material from which the anode 23 is formed is not limited to that of the present invention. Examples of transparent conductive material that can be used for the transparent anode include ITO and IZO (indium-zinc oxide).

A power line (not shown) is disposed on the first interlayer insulation film 21a, and the power line is connected to the drain area by way of the contact hole 22b.

As described above, thin film transistors 25 for driving are formed on the circuit element portion 12 and are connected to the anodes 23.

Bank Portion Formation Step (S2)

Next, the substrate 10A shown in FIG. 5 undergoes the bank portion formation step (S2). First, in this step, an inorganic bank layer 28a is formed on the second interlayer insulation film 21b. The inorganic bank layer 28a is formed by first forming an inorganic film on the formation positions and then patterning the inorganic film with photolithography technology or the like. At this point, portions of the inorganic bank layer 28a are formed so as to overlap the peripheral portions of the anodes 23.

Next, organic bank layer 28b is formed on the inorganic bank layer 28a. The organic bank layer 28b is also patterned and formed by photolithography technology in the same manner in which the inorganic bank layer 28a is formed. Thus, bank portions 28 composed of the inorganic bank layers 28a and the organic bank layers 28b are formed in this manner. Also, apertures 29 that open upward with respect to the anodes 23 are formed in a corresponding manner between the bank portions 28. The apertures 29 define the pixel areas.

Surface Treatment Step (S3)

Lyophilization treatment and liquid-repelling treatment are performed in the subsequent surface treatment step (S3). The areas in which lyophilization treatment is carried out are the electrode surfaces of the anode 23 and the first laminated portions of the inorganic bank layer 28a. These surfaces are lyophilically treated by plasma treatment using oxygen as the treatment gas, for example. The plasma treatment also serves to clean the ITO, from which the anode 23 is made. Also, the liquid-repelling treatment is carried out on the wall surfaces of the organic bank layer 28b and on the upper surfaces of the organic bank layer 28b. The surfaces are fluorinated (treated for water-repellency) by the plasma treatment in which tetrafluoromethane is used as the treatment gas, for example.

By carrying out this surface treatment step, functional droplets can be deposited with a greater accuracy in the pixel areas when forming a functional layer 27 using the depositing device in the later steps. Also, the functional droplets deposited in the pixel areas can be prevented from flowing out of the apertures 29.

Figure 6:
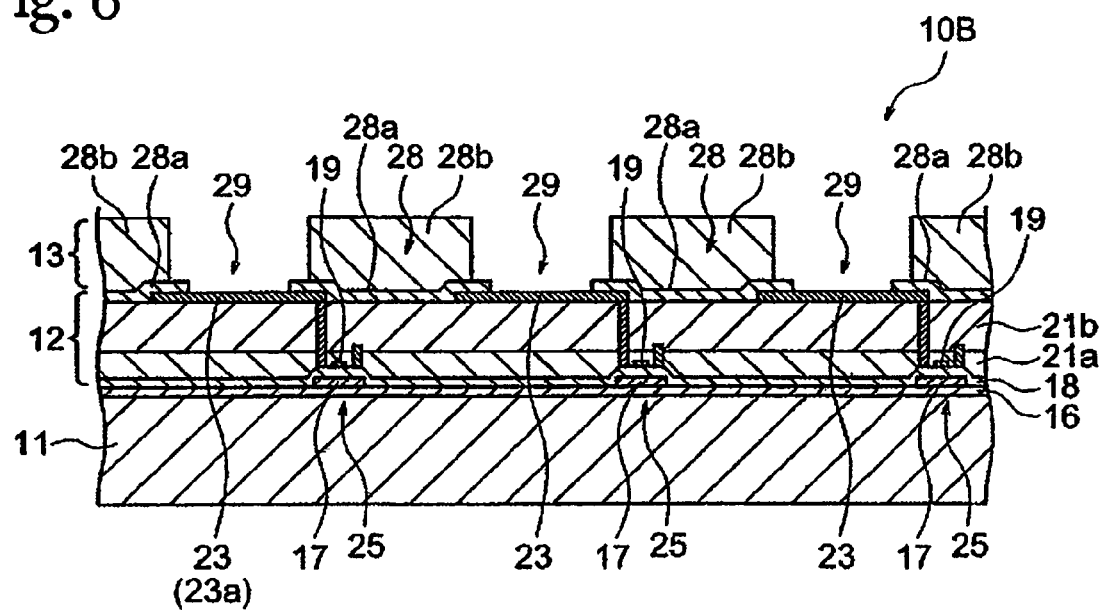
FIG. 6 is a cross-sectional view of the laminated organic EL element at a manufacturing step of the manufacturing method according to the embodiment of the present invention.

The display apparatus substrate 10B shown in FIG. 6 can be obtained with the above-described steps.

The display apparatus substrate 10B is placed on the setting table 128 of the droplet depositing device shown in FIG. 3 (or a similar apparatus). Then, the following hole injection/transport layer (I) formation step (S4), light-emitting layer (I) formation step (S5), and charge-generating layer formation step (S6) are carried out.

Hole Injection/Transport Layer (I) Formation Step (S4)

In the hole injection/transport layer formation step (S4), a first composition containing the material for forming a hole injection/transport layer is deposited from the inkjet head 122 shown in FIG. 3 into the apertures 29, which are pixel areas. Thereafter, drying and heating treatments are performed, a polar solvent contained in the first composition is vaporized, and the hole injection/transport layer 27a is formed on the anodes 23 (electrode surfaces 23a).

Figure 7:
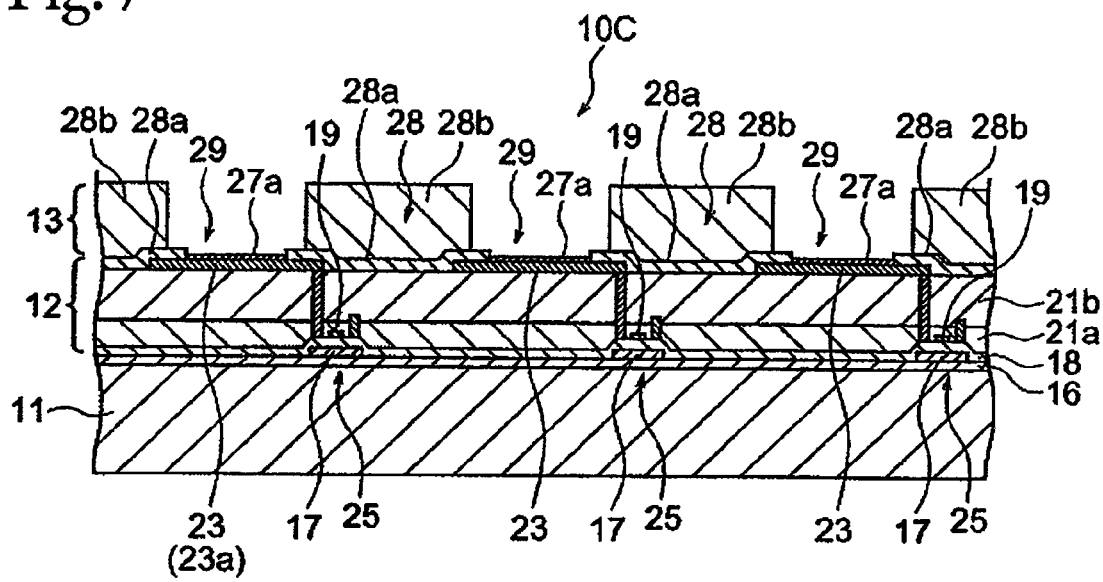
FIG. 7 is a cross-sectional view of the laminated organic EL element at a manufacturing step of the manufacturing method according to the embodiment of the present invention.

The substrate 10C shown in FIG. 7 is obtained in this manner.

Light-Emitting Layer Formation Step (S5)

The light-emitting layer formation step (S5) is described next.

The light-emitting layer can be formed by depositing a second composition for use in the formation of a light-emitting layer using substantially the same depositing device as the one shown in FIG. 3.

In the light-emitting layer formation step, in order to prevent the redissolution of the hole injection/transport layers 27a as described above, a non-polar solvent that does not dissolve the hole injection/transport layer 27a is preferably used as the solvent of the second composition.

Conversely, since the hole injection/transport layer (I) 27a has a low affinity for the non-polar solvent, the hole injection/transport layer 27a and the light-emitting layers 27b cannot be brought into close contact or the light-emitting layers 27b may not be uniformly applied even if a second composition containing a non-polar solvent is deposited onto the hole injection/transport layer 27a.

In view of the above, surface treatment (surface improving treatment) is preferably performed prior to the formation of the light-emitting layers 27b in order to increase the affinity of the surface of the hole injection/transport layers 27a for the material used to form the light-emitting layers 27b as well as for the non-polar solvent. The surface treatment is carried out by applying a surface improving material to the hole injection/transport layers 27a, and drying the resulting coating. The surface improving material is the same solvent as or a related solvent of the non-polar solvent of the second composition that is used in forming the light-emitting layers.

By carrying out such a treatment, the surfaces of the hole injection/transport layer 27a gains affinity to the non-polar solvent, and the second composition containing the material for forming the light-emitting layers can be uniformly applied to the hole injection/transport layers 27a in later steps.

Figure 8:
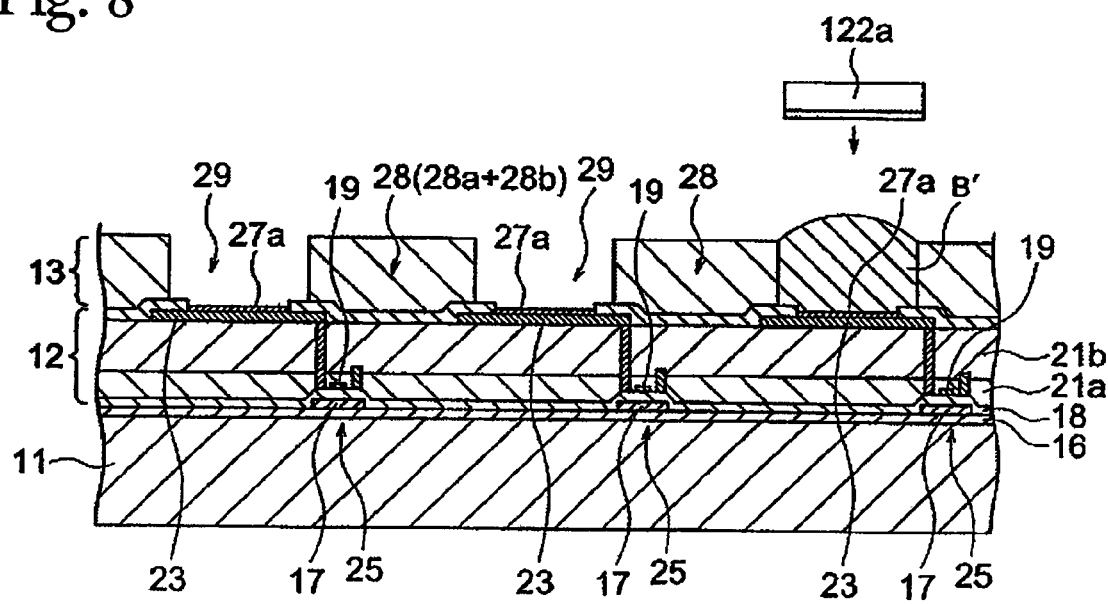
FIG. 8 is a cross-sectional view of the laminated organic EL element at a manufacturing step of the manufacturing method according to the embodiment of the present invention.

In other words, the second composition (B') containing the material that forms the light-emitting layers and that corresponds to one of the selected colors (blue (B) in the example of FIG. 8) is deposited from the deposit head 122a into the pixel area (apertures 29) as functional droplets, as shown in FIG. 8. The second composition (B') deposited into the pixel area spreads over the hole injection/transport layers 27a and fills the aperture 29. It should be noted that even if the second composition were to miss the pixel areas and be deposited on the upper surface of the bank portions 28, the second composition easily rolls into the adjacent aperture 29 because the upper surfaces of the bank portions 28 have been subjected to the liquid-repellent treatment as described above.

Figure 9:
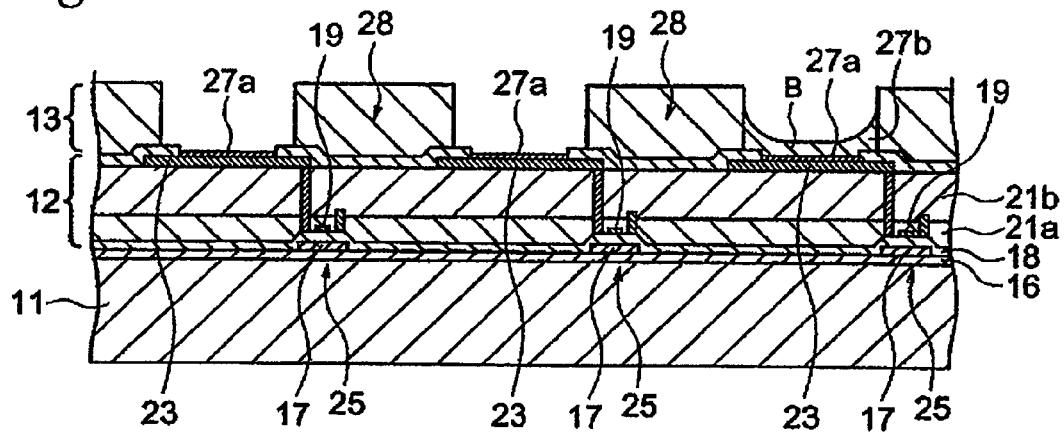
FIG. 9 is a cross-sectional view of the laminated organic EL element at a manufacturing step of the manufacturing method according to the embodiment of the present invention.

By thereafter performing the drying step and other steps, the second composition is dried after the depositing, the non-polar solvent contained in the second composition is vaporized, and the light-emitting layer 27b is formed on the hole injection/transport layer 27a, as shown in FIG. 9. In the case of FIG. 9, the light-emitting layer 27b corresponds has the color of blue (B).

Next, the same steps are sequentially carried out, using substantially the same functional droplet deposit head 122a as the one shown in FIG. 8, in the same manner as the case in which the light-emitting layer 27b of the color blue (B) is formed as described above to form light-emitting layers 27b of other colors (red (R) and green (G)).

It should be noted that the order in which the light-emitting layers 27b are formed is not limited to the order described in this embodiment. Instead, the light-emitting layers 27b may be formed in any order. For example, it is possible to determine the order of formation in accordance with the light-emitting layer formation material. Also, examples of the arrangement pattern of the three colors red (R), green (G), and blue (B) include a striped arrangement, a mosaic arrangement, and a delta arrangement.

The light-emitting layers 27b emit light in any of the colors red (R), green (G), or blue (B), and are formed by depositing the second composition (functional liquid) containing the material for forming a light-emitting layer (light-emitting material).

A known material that does not dissolve the hole injection/transport layers 27a is preferably used as the solvent (non-polar solvent) of the second composition. By using such non-polar solvent in the second composition of the light-emitting layer 27b, the light-emitting layers 27b can be formed without redissolving the hole injection/transport layers 27a. In the light-emitting layers 27b, the holes injected from the hole injection/transport layers 27a and the electrons injected from the anodes recombine and emit light in the light-emitting layers 27b.

Examples of materials from which the light-emitting layer can be formed include cyano polyphenylene vinylene precursors. Examples of material for colored organic light-emitting layers include, as red light-emitting materials, a mixture of 2-(13',4'-dihydroxyphenyl)-3,5,7-trihydroxy-1-benzopyrylium perchlorate and 1,1-bis-(4-N,N-ditolylaminophenyl)cyclohexane; as green light-emitting materials, polyphenylene vinylene precursors and a mixture of 2,3,6,7-tetrahydro-11-oxo-1H,5H,11H-(1)benzopyrano[6,7,8-ij]-quinolizine-10-carboxylic acid and 1,1-bis-(4-N,N-ditolylaminophenyl)cyclohexane; and as blue light-emitting materials, aluminum quinolinol complexes and a mixture of tris(8-hydroxyquinolinol)aluminum and 2,3,6,7-tetrahydro-9-methyl-11-oxo-1H,5H,11H-(1)benzopyrano[6,7,8-ij]-quinolizine.

Other materials that may be used include aromatic diamine derivatives (TPD), oxydiazole derivatives (PBD), oxydiazole dimers (OXD-8), distil-arylene (DSA) derivatives, beryllium-benzoquinolinol complexes (Bebq), triphenylamine derivatives (MTDATA), rubrene, quinacridone, triazole derivatives, polyphenylene, polyalkyl fluorene, polyalkyl thiophene, azomethine zinc derivatives, porphyrin zinc complexes, benzoxazole zinc complexes, and phenanthroline europium complexes, but the present invention is not limited thereby.

More specifically, tetracyano anthraquinodimethane derivative shown in the following formula:

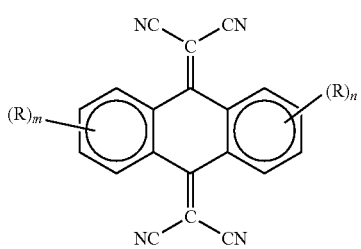

where R is a one of halogen atom, alkyl group, aryl group, aralkyl group, oxylalkyl group, oxyaryl group, oxyaralkyl group, hyderoxy group, substituted amino group, carboxyl group, cyano group and nitro group, and m=1 when n=1 and m=0 when n=2, which is shown in Japanese Patent Application Publication No. 63-70257;

diphenyldicianoethylene derivative shown in the following formula:

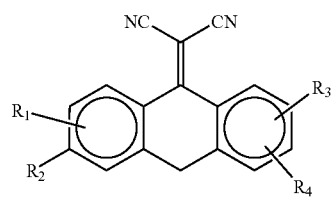

Where R1 is H or nitro or alkoxycarbonyl group, R2 is alkyl, alkoxy, nitro, cyano or alkoxy carbonyl group, R3 is H or a halogen atom, or an alkoxy carbony or nitro group, R4 is H or a halogen atom, an alkyl, cyano, nitro, alkoxy carbony group, a substituted or unsubstituted phenyl, a substituted or unsubstituted 4-phenyl phenyl group, which is shown in Japanese Patent Application Publication No. 63-175860;

a compound shown in the following formula:

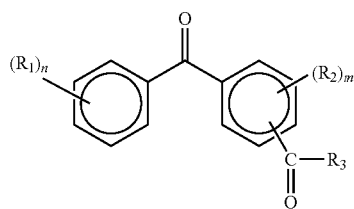

where R1 and R2 are each H, an alkyl group, aryl group, alkoxycarbonyl group, aryloxycarbonyl group, nitro group, halogen atom, alkylcarbonyl group, or arylcarbonyl group, R3 is a substituted aryl or N-containing heterocyclic group, m is 0 or 1, n is 0-2, which is shown in Japanese Patent Application Publication. 2-135361;

a compound shown in the following formula:

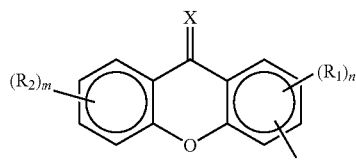

where R1 and R2 are each H, an alkyl group, aryl group, alkoxycarbonyl group, aryloxycarbonyl group, nitro group, halogen atom, or a cyano group, and m and n are 0-2, which is shown in Japanese Patent Application Publication. 2-135359;

a diphenoquinone derivative shown in the following formula:

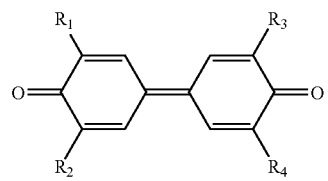

where R1-R4 are an alkyl group, an aryl group, an alkoxyl group, or a halogen atom, which is shown in Japanese Patent Application Publication No. 3-152184, and other known materials may be used. These compounds may be used singularly, or in combination of two or more of them may be used.

Figure 10:
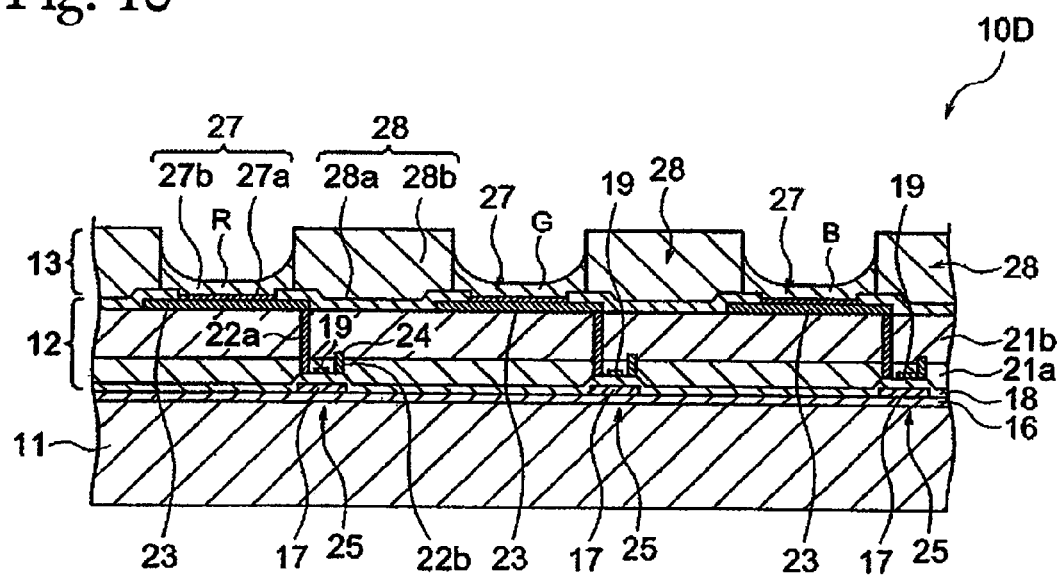
FIG. 10 is a cross-sectional view of the laminated organic EL element at a manufacturing step of the manufacturing method according to the embodiment of the present invention.

As described above, a substrate 10D where functional layers 27, in other words the hole injection/transport layers 27a and light-emitting layers 27b, are formed on the transparent anode 23 is obtained in the manner shown in FIG. 10.

Charge-Generating Layer (I) Formation Step (S6)

Next, the description will be given of the charge-generating layer (I) formation step (S6).

Figure 11:
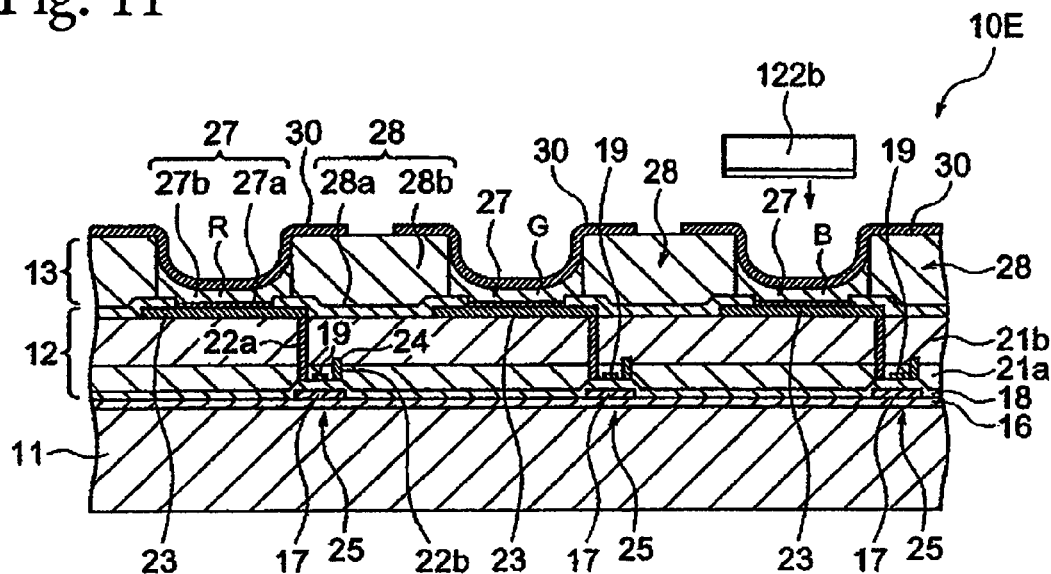
FIG. 11 is a cross-sectional view of the laminated organic EL element at a manufacturing step of the manufacturing method according to the embodiment of the present invention.

The charge-generating layer can be formed by depositing a composition containing a material for forming the charge-generating layer to predetermined positions on the light-emitting layers (I) 27b and the bank portions (I) 28 from the droplet deposit head 122 shown in FIG. 11, and thereafter carrying out drying and heating steps.

The charge-generating layer formed in the present embodiment is an electrical insulation layer preferably having an electrical resistivity of $1.0 \times 10^2$ Ω·cm or higher, and more preferably $1.0 \times 10^5$ Ω·cm or higher. Also, the charge-generating layer formed in the present embodiment preferably has a visible light transmittance of 50% or higher. If the visible light transmittance is less than 50%, the generated light is absorbed when it passes through the charge-generating layer, and it may not be possible to obtain the desired quantum efficiency (current efficiency) even with a plurality of light-emitting units.

The material to be used for forming a charge-generating layer is not particularly limited as long as a layer is formed that serves to inject electrons in the anode direction and inject holes in the cathode direction of the element when voltage is applied. It is possible to use an organic or inorganic substance as the material for forming the charge-generating layer. A preferable material is one which is composed of a laminated or mixed layer of two different types of substances, which has a charge-transfer complex composed of a radical cation and a radical anion produced by an oxidation-reduction reaction between the two types of substances. In such preferable material, holes are injected into the light-emitting units in contact with the cathode side of the charge-generating layer and electrons are injected into the light-emitting units in contact with the anode side of the charge-generating layer due to the respective movement of the radical cation state and radical anion state in the charge-transfer complex in the cathode direction and anode direction, respectively, when voltage is applied.

Examples of organic compounds that can be used as the charge-generating layer formation material includes the arylamine compound shown in the general formula (I), and organic compounds having at least one fluorine as a substituent and also having electron-accepting characteristics.

Kinds of arylamine compound are not limited to particularly ones, and examples of arylamine compounds to be used as the charge-generating layer formation material include such arylamine compounds as phosphamine derivatives such as the ones shown in Japanese Patent Application Publication No. 6-25659;

diphenylamine derivatives shown as the following formula:

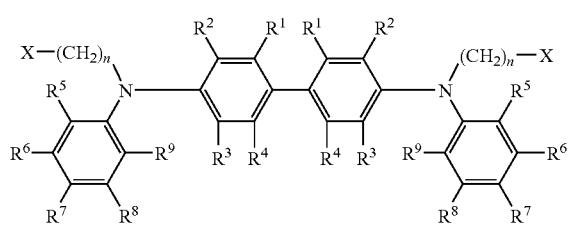

where X is anthracenyl, phenanthrenyl, pyrenyl or perylenyl substituted with a halogen, amino, cyano, alkoxycarbonyl, alkyl, alokoxy, aryl or aralkyl group, n is 1-10, each of R1-R9 is H, F, Cl, Br, amino, cyano, alkoxycarbonyl, alkyl, alkoxy, aryl or arakyl group, which is disclosed in Japanese Patent Application Publication 7-224012; arylamine derivatives described in U.S Pat. Nos. 3,567,450, 3,180,703, 3,240,597, 3,658,520, 4,232,103, 4,175,961, 4,012,376;

compounds shown in Japanese Patent Application Publication No. 6-203963 as the following formula:

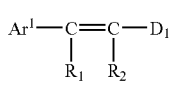

where $Ar^1$ is an aryl group having 6-20 carbon atoms, $R_1$-$R_2$ are H or an aryl group having 6-20 carbon atoms, and $D_1$ is an aryl group having 6-20 carbon atoms replaced with an electron-releasing group, and each of $Ar^1$ and $R_1$-$R_2$ may be not replaced, or may be replaced with an alkyl group having 1-10 carbon atoms, an alkoxy group having 1-10 carbon atoms, aryloxy group having 6-10 carbon atoms, an arylalkyl group having 6-10 carbon atoms, or an amino group having 1-20 carbon atoms, such compounds including compounds shown as the following formulae:

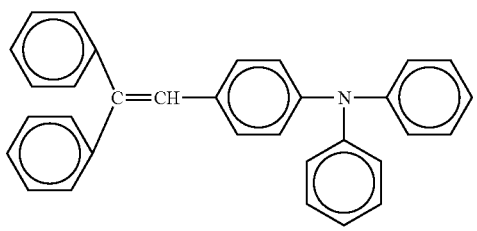

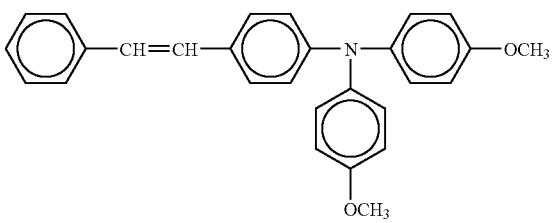

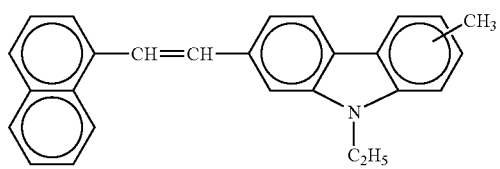

compounds shown in Japanese Patent Application Publication No. 6-203963 as the following formula:

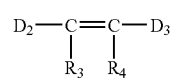

where $R_3$-$R_4$ are H or an aryl group having 6-20 carbon atoms, and $D_2$-$D_3$ are aryl groups having 6-20 carbon atoms replaced with an electron-releasing group, and each of $R_3$-$R_4$ may be not replaced, or may be replaced with an alkyl group having 1-10 carbon atoms, an alkoxy group having 1-10 carbon atoms, aryloxy group having 6-10 carbon atoms, an arylalkyl group having 6-10 carbon atoms, or an amino group having 1-20 carbon atoms., such compounds including compounds shown as the following formulae:

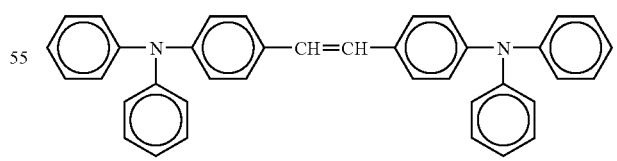

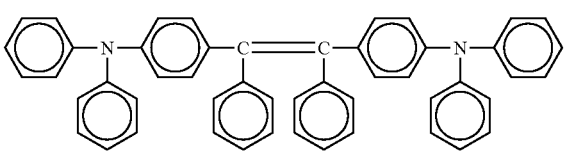

compounds shown in Japanese Patent Application Publication No. 6-203963 as the following formula:

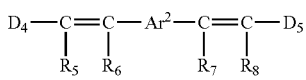

where $Ar^2$ is an arylene group having 6-20 carbon atoms, $R_5$-$R_8$ are H, and $D_4$-$D_5$ are an aryl group having 6-20 carbon atoms replaced with an electron-releasing group, and each of $Ar^2$ and $R_5$-$R_8$ may be not replaced, or may be replaced with an alkyl group having 1-10 carbon atoms, an alkoxy group having 1-10 carbon atoms, aryloxy group having 6-10 carbon atoms, an arylalkyl group having 6-10 carbon atoms, or an amino group having 1-20 carbon atoms, such compounds including compounds shown as the following formulae:

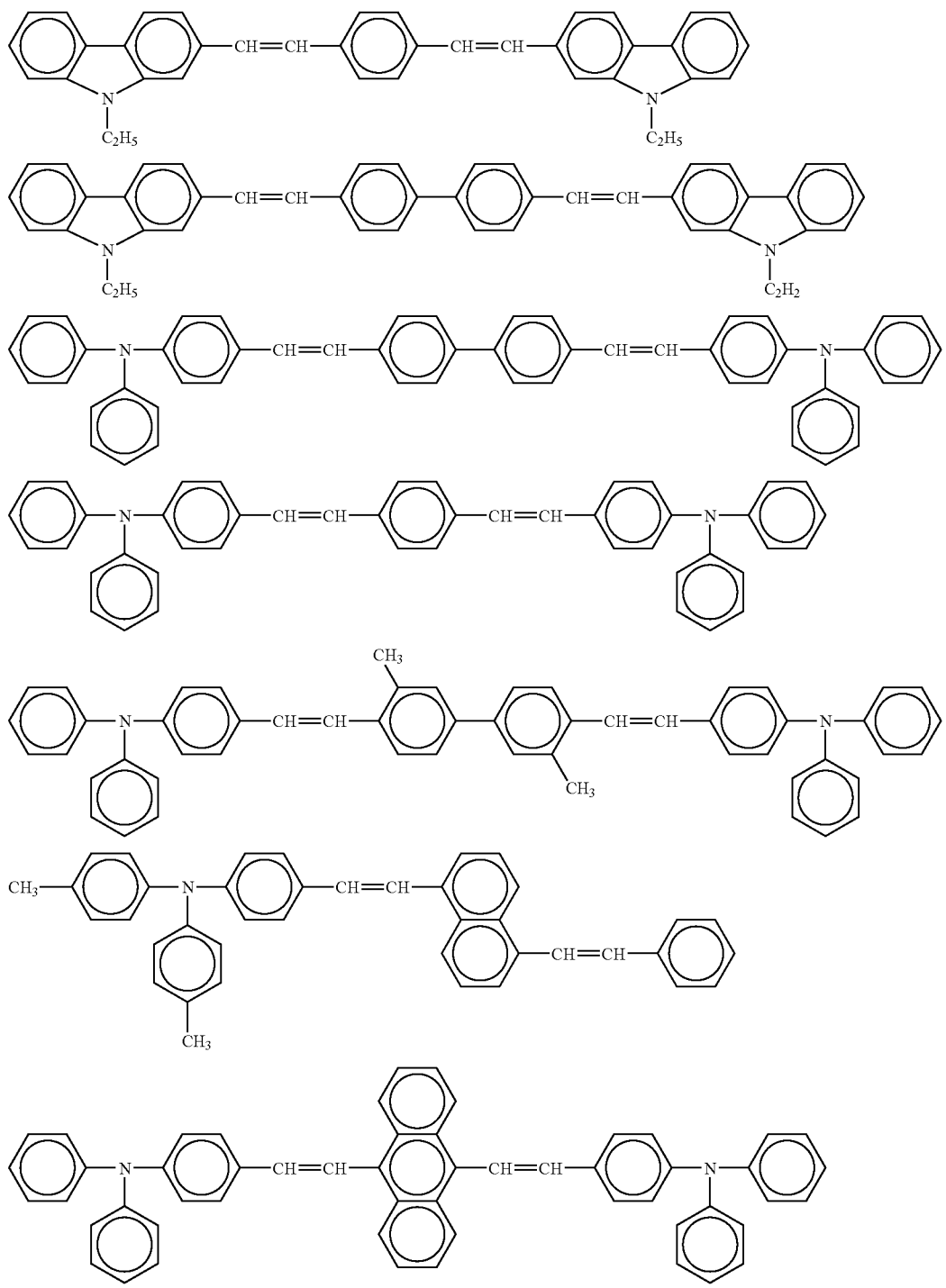

-continued

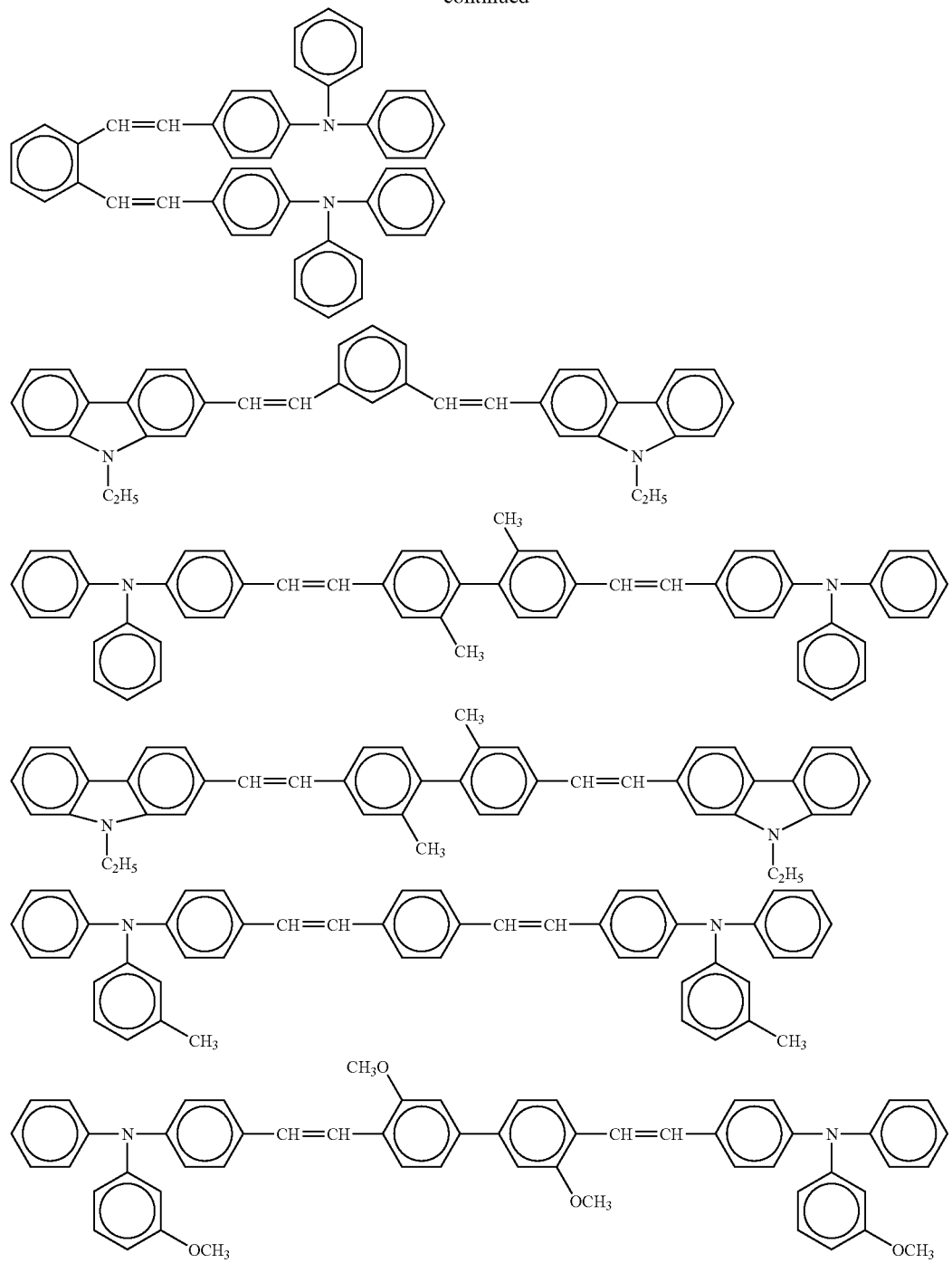

compounds shown in Japanese Patent Application Publication No. 6-203963 as the following formula:

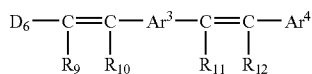

where $Ar^3$ is an arylene group having 6-20 carbon atoms, $Ar^4$ is an aryl group having 6-20 carbon atoms, $R_9$-$R_{12}$ are H, and $D_6$ is an aryl having 6-20 carbon atoms replaced with an electron-releasing group, and each of $Ar^3$-$Ar^4$ and $R_9$-$R_{12}$ may be not replaced, or may be replaced with an alkyl group having 1-10 carbon atoms, an alkoxy group having 1-10 carbon atoms, aryloxy group having 6-10 carbon atoms, an arylalkyl group having 6-10 carbon atoms, or an amino group having 1-20 carbon atoms, such compounds include compounds shown as the following formulae:

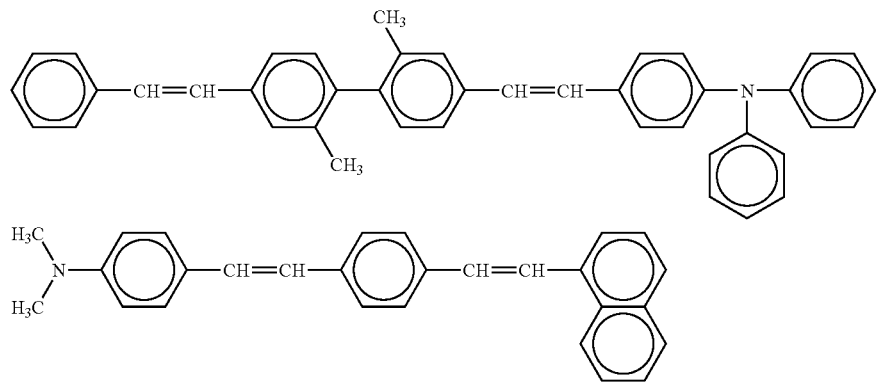

aromatic third class amine compounds and styryl amine compounds such as those described in Japanese Patent Application Publication No. 6-215874;

triazine derivative shown as the following formula (i):

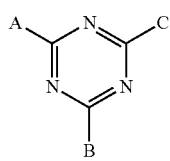

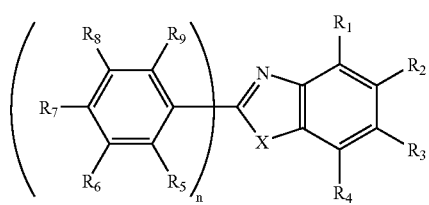

where each of A, B, C of (i) is shown as (ii), and R1-R9 are each H, F, Cl, an alkyl group, an alkoxy group, a dialkylamino group, an alkanoyloxy group, an alkyloxycarbonyl group, an aryl group, a cyano group, an alkanoyl group or a trifluoromethyl group, X is O, S, or $NR_{10}$ ($NR_{10}$ being H, an alkyl group or an aryl group), which is described in Japanese Patent Application Publication No. 7-157473;

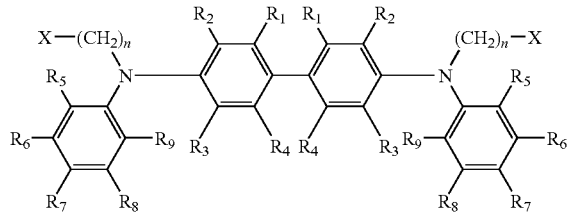

Where X is a halogen, n=1-10, R1-R9 are H, F, etc., which is described in Japanese Patent Application Publication No. 7-224012;

aromatic diamine compounds shown as the following formula:

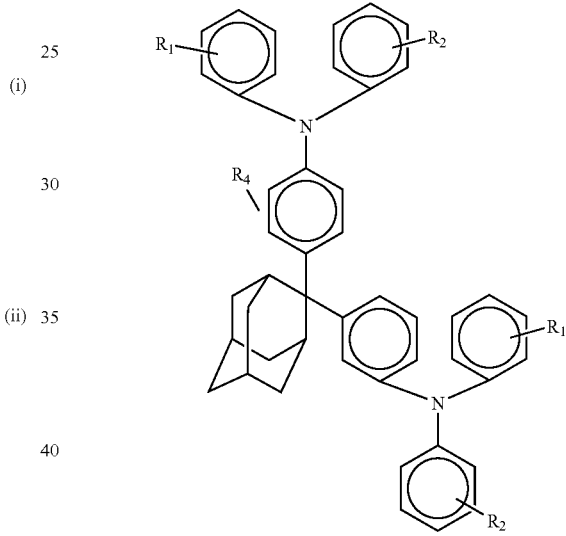

where R1 and R2 or H or a lower alkyl group, which is described in Japanese Patent Application Publication No. 7-145116;

a tetraaryl diamine derivative shown in the following formula:

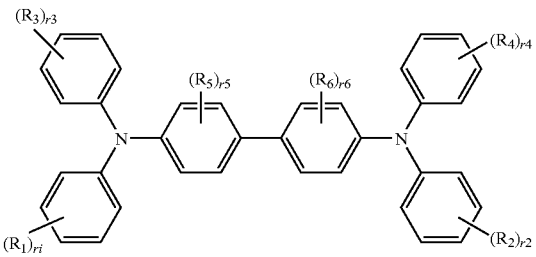

where at least one of $R_1$-$R_4$ is an aryl group and r1-r4 is an integer between 0-4 while at least one of r1-r4 is greater than 0, which is described in Japanese Patent Application Publication No. 8-48656;

a bendizine compound shown in the following formula (i):

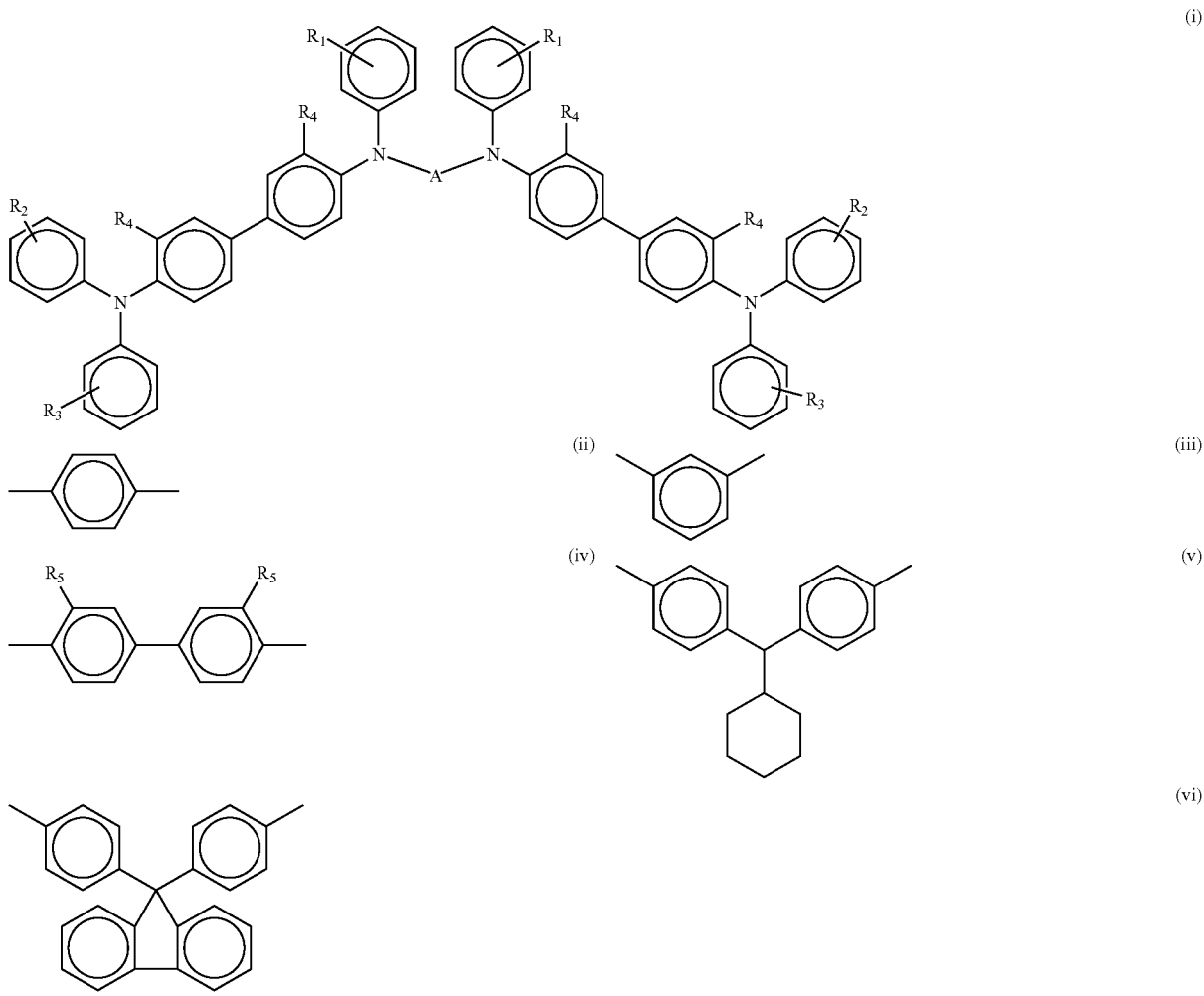

where R1-R3 are each H, lower alkyl or lower alkoxy group; R4 is H, a lower alkyl or lower alkoxy group or Cl, A is one of (ii)-(vi), which is described in Japanese Patent Application Publication No. 7-126226;

diamino diphenyl compounds as shown in the following formula:

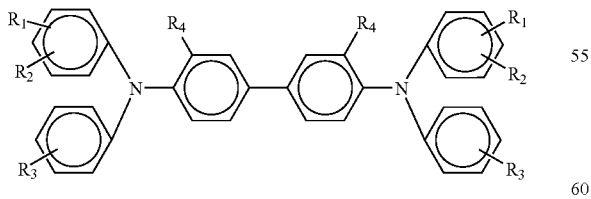

where R1 and R2 are each a halogen, an alkyl, an alkoxyl, an araklyl, or a phenyl group having a lower alkyl or lower alkoxy substituent, and R3 is H, a halogen, an alkyl, an alkoxyl or an aralyl group, which is described in Japanese Patent Application Publication No. 7-188130;

triphenylamine derivatives shown as the following formula (i):

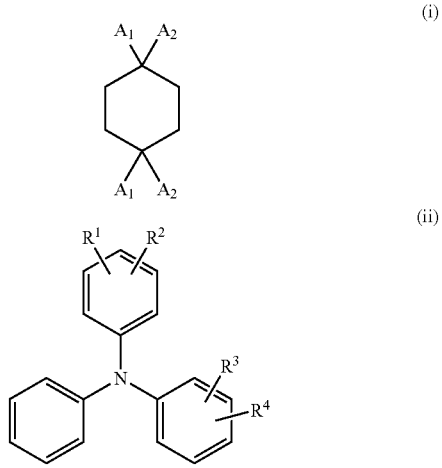

where A1 is a triphenylamine group shown in the formula (ii) and A2 is H or the triphenylamine group shown in the formula (ii), which is shown in Japanese Patent Application Publication No. 8-40995;

triphenylamine derivatives shown as the following formula (i):

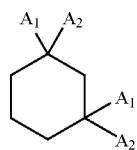

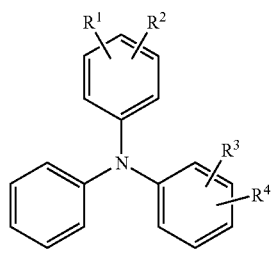

where A1 is a triphenylamine group shown in the formula (ii) and A2 is H or the triphenylamine group shown in the formula (ii), which is shown in Japanese Patent Application Publication No. 8-40996;

triphenylamine derivatives shown as the following formula (i):

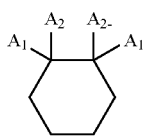

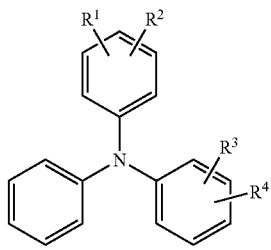

where A1 is a triphenylamine group shown in the formula (ii) and A2 is H or the triphenylamine group shown in the formula (ii), which is shown in Japanese Patent Application Publication No. 8-40997;

tetraphenylbenzidine compound shown in the following formula:

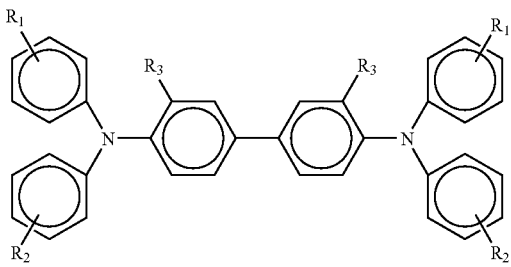

where R1 and R2 are each H, a lower alkyl or a lower alkoxy, and at least one of R1 and R2 is n-butyl, isobutyl, sec-butyl or t-butyl, and R3 is H, a methyl or a methoxy group, or a Cl), which is shown in Japanese Patent Application Publication No. 7-126225;

pyrene derivatives shown in the following formula:

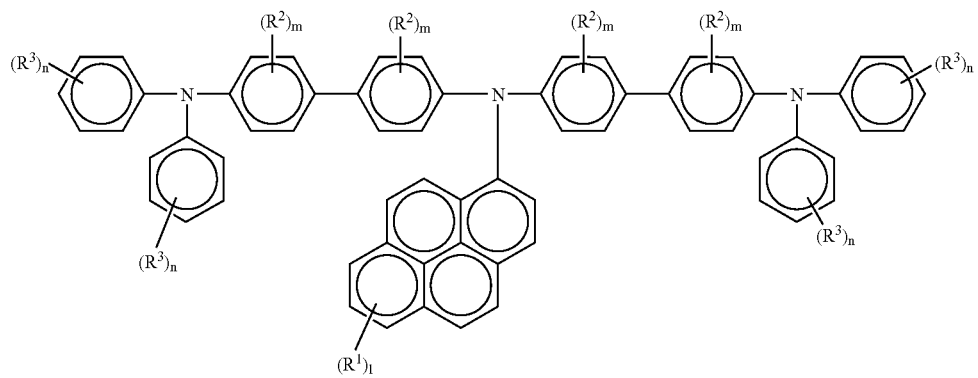

where R1-R3 are halogen, cyano, nitro, trifluoromethyl, amino, (substituted or unsubstituted) alkyl, alkoxy or aryl group, l is 0-9, m is 0-4, and n is 0-5, which is shown in Japanese Patent Application Publication No. 7-101911; and tris(arylamino)benzene derivatives shown in the following formula:

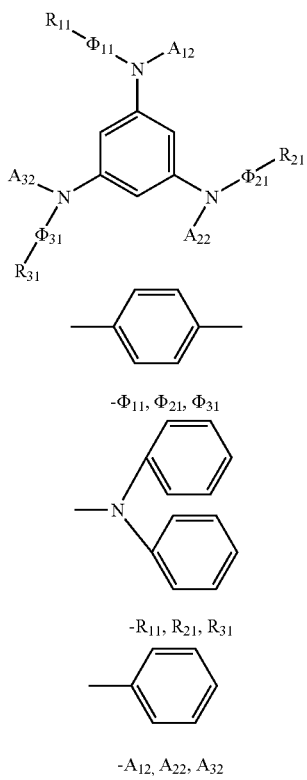

which is shown in Japanese Patent Application Publication 7-97355.

More specific examples include N,N,N',N'-tetraphenyl-4,4'-diaminophenyl, N,N'-diphenyl-N,N'-di(3-methylphenyl)-4,4'-diaminobiphenyl, 2,2-bis(4-di-p-tolylamino)propane, N,N,N',N'-tetra-p-tolyl-4,4'-diaminobiphenyl, bis(4-di-p-tolylaminophenyl)phenylmethane, N,N'-diphenyl-N,N'-di(4-methoxyphenyl)-4,4'-diaminophenyl, N,N,N',N'-tetraphenyl-4,4'-diaminodiphenyl ether, 4,4'-bis(diphenylamino)quadriphenyl, 4-N,N-diphenylamino-(2-diphenyl vinyl)benzene, 3-methoxy-4'-N,N-diphenylaminostilbenzene, N-phenyl carbazole, 1,1-bis(4-di-p-triaminophenyl)-cyclohexane, 1,1-bis(4-di-p-triaminophenyl)-4-phenyl cyclohexane, bis(4-dimethylamino-anode-2-methylphenyl)-phenyl methane, N,N,N-tri(p-tolyl)amine, 4-(di-p-tolylamino)-4'-[4(di-p-tolylamino)styryl]stilbene, N,N,N',N'-tetraphenyl-4,4'-diamino-biphenyl N-phenyl carbazole, 4,4'-bis[N-(1-naphthyl)-N-phenyl-amino]biphenyl, 4,4"-bis[N-(1-naphthyl)-N-phenyl-amino]p-terphenyl, 4,4'-bis[N-(3-acenaphthenyl)-N-phenyl-amino]biphenyl, 1,5-bis[N-(1-naphthyl)-N-phenyl-amino]naphthalene, 4,4'-bis[N-(9-anthryl)-N-phenyl-amino]biphenyl, 4,4"-bis[N-(1-anthryl)-N-phenyl-amino]p-terphenyl, 4,4'-bis[N-(2-phenanthryl)-N-phenyl-amino]biphenyl, 4,4'-bis[N-(8-fluoranthenyl)-N-phenyl-amino]biphenyl, 4,4'-bis[N-(2-pyrenyl)-N-phenyl-amino]biphenyl, 4,4'-bis[N-(2-perylenyl)-N-phenyl-amino]biphenyl, 4,4'-bis[N-(1-coronenyl)-N-phenyl-amino]biphenyl, 2,6-bis(di-p-tolylamino)naphthalene, 2,6-bis[di-(1-naphthyl)amino]naphthalene, 2,6-bis[N-(1-naphthyl)-N-(2-naphthyl)amino]naphthalene, 4,4"-bis[N,N-di(2-naphthyl)amino]terphenyl, 4,4'-bis {N-phenyl-N-[4-(1-naphthyl)phenyl]amino}biphenyl, 4,4'-bis[N-phenyl-N-(2-pyrenyl)-amino]biphenyl, 2,6-bis[N,N-di(2-naphthyl)amino]fluorine, 4,4"-bis(N,N-di-p-tolylamino)terphenyl, bis(N-1-naphthyl) (N-2-naphthyl)amine, 4,4'-bis[N-(2-naphthyl)-N-phenyl-amino]biphenyl(α-NPD) represented by the following formula:

[Chemical Formula 2]

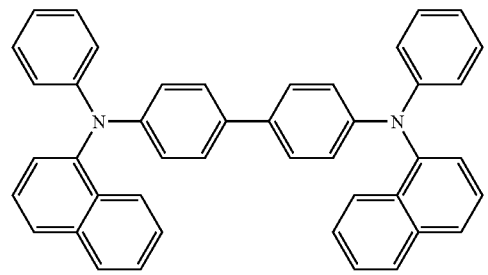

spiro-NPB represented by the following formula

[Chemical Formula 3]

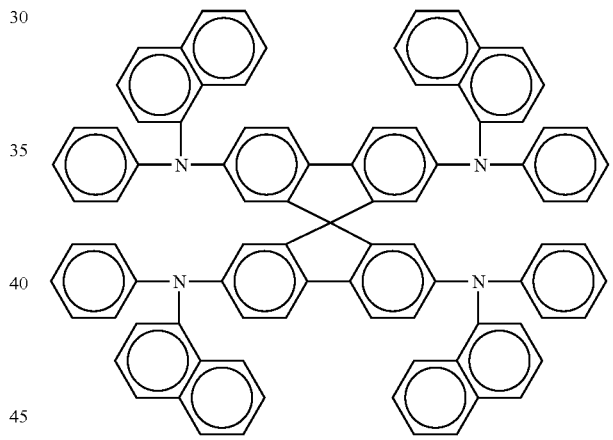

spiro-TAD represented by the following formula

[Chemical Formula 4]

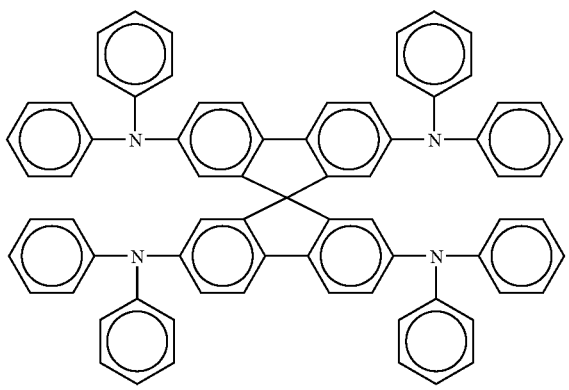

and 2-TNATA represented by the following formula

[Chemical Formula 5]

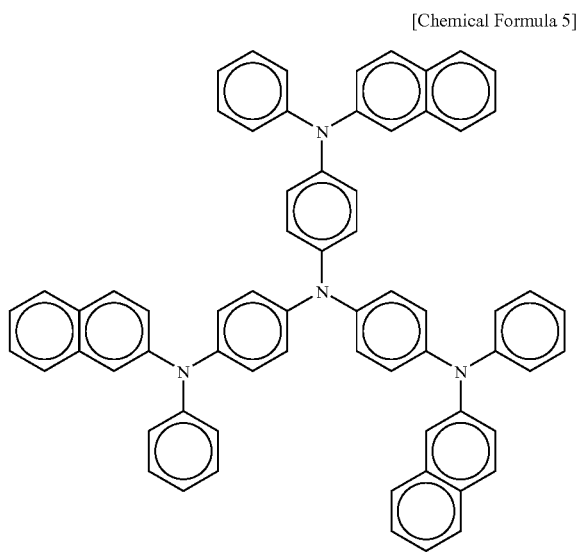

It should be noted that the arylamine compounds having a glass transition point of 90° C. or higher are preferable from the aspect of heat resistance of the element.

In the present invention, other known compounds that are used in the fabrication of conventional organic EL elements may also be used.

Examples of the organic compound having at least one fluorine as a substituent and also having electron-accepting characteristics include DDQ (dicyano-dichloroquinone), TNF (trinitrofluorene), TCNQ (tetracyanoquinodimethane), and 4F-TCNQ.

Examples of the inorganic compound that can be used as the material for forming a charge-generating layer include metal oxides such as vanadium oxide ($V_2O_5$) and rhenium oxide ($Re_2O_7$) as well as metal halides such as ferric chloride, ferric bromide, ferric iodide, aluminum chloride, aluminum bromide, aluminum iodide, potassium chloride, potassium bromide, potassium iodide, indium chloride, indium bromide, indium iodide, antimony pentachloride, arsenic pentafluoride, and boron trifluoride.

More preferable among these materials for forming a charge-generating layer are materials that have (a) an organic compound that has an ionization potential lower than 5.7 eV as well as the hole transportability, in other words the electron-donating characteristics, and (b) a laminated or a mixed layer of an inorganic compound or an organic compound that is capable of forming a change-transfer complex produced by the oxidation-reduction reaction with the organic compound (a), with the charge-transfer complex being produced by an oxidation-reduction reaction between (a) and (b).

It is generally preferable that the ionization potential be less than 5.7 eV so that the organic compound having the electron-donating characteristics enters a radical cation state easily. This is due to the fact that when the ionization potential of the organic compound of component (a) is 5.7 eV or higher, it becomes difficult to create an oxidation-reduction reaction with the substance of component (b), and as a result, it becomes difficult to form a charge-transfer complex in the present invention.

Whether the two types of compounds constituting the charge-generating layer will form a charge-transfer complex by an oxidation-reduction reaction can be confirmed by using a spectroscopic analysis device. More specifically, although two types of compounds do not exhibit an absorption spectrum peak in the near infrared area with a wavelength of 800 to 2,000 nm if they do not form a charge-transfer complex, but a mixed film of the two types of compounds has an absorption spectrum peak in the near infrared area with a wavelength of 800 to 2,000 nm. In this manner, it is possible to confirm the presence of an electron transfer between the two types of compounds.

As shown in FIG. 11, a substrate 10E in which charge-generating layers 30 are formed on the functional layers 27 (light-emitting layers 27b) and bank portions 28 can be obtained as described above.

Hole Injection/Transport Layer (II) Formation Step (S7) and Light-Emitting Layer (II) Formation Step (S8)

Next, using the substrate 10E obtained as described above, a bank portion (II) 31 is formed in the same manner as the formation of the bank portion (I) 28 described above, hole injection/transport layers (II) 32a are formed (S7) on the charge-generating layers 30 in the same manner as the formation of the hole injection/transport layers (I), and light-emitting layers (II) 32b are formed (S8) on the hole injection/transport layers (II) 32a in the same manner as the light-emitting layers (I).

Figure 12:
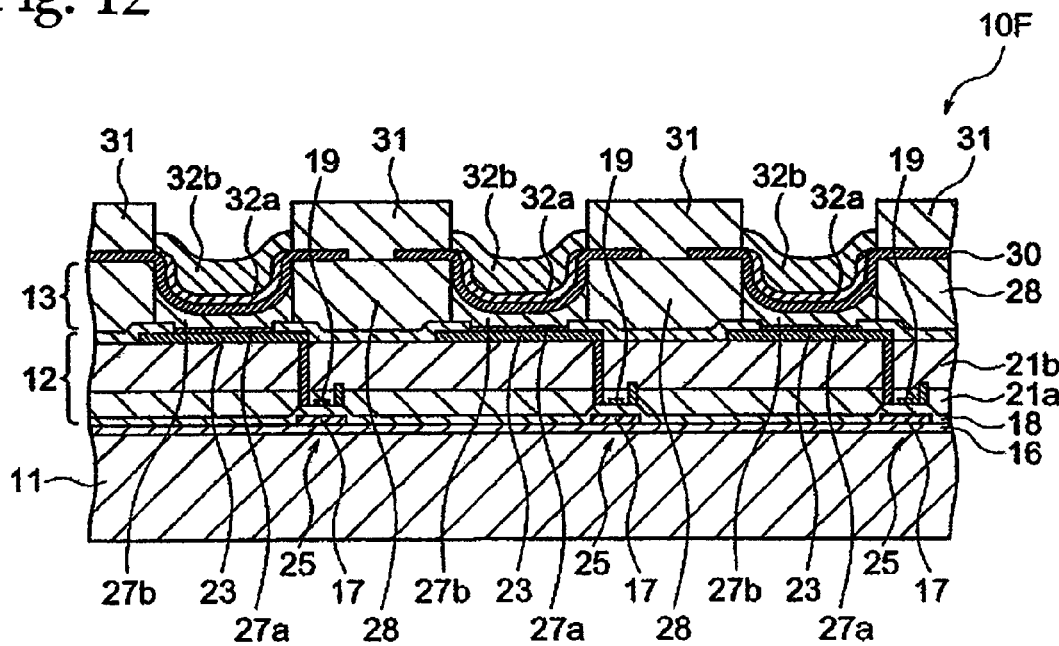
FIG. 12 is a cross-sectional view of the laminated organic EL element at a manufacturing step of the manufacturing method according to the embodiment of the present invention.

The substrate 10F shown in FIG. 12 is thus obtained.

In the present embodiment, an ink composition containing materials for forming the hole injection/transport layers, materials for forming the light-emitting layers, and materials for forming the charge-generating layers preferably have the following characteristics.

The viscosity of the ink composition is preferably in the range of 1 to 20 mPa·s, and particularly preferably in the range of 2 to 8 mPa·s. If the viscosity of the ink composition is less than 1 mPa·s, not only does it become more difficult to control the deposit quantity, but also the solid concentration of the deposit decreases. As a result, an adequate film cannot be formed.

If the viscosity exceeds 20 mPa·s, it may become difficult to smoothly deposit the ink composition from the nozzle holes, and it may become necessary to increase the size of the nozzle holes and to modify other apparatus specifications. If the viscosity is even greater, the solid content in the ink composition precipitates too easily. Therefore, the frequency of nozzle hole clogging tends to increase.

The surface tension of the ink composition is preferably in the rage of 20 to 70 mN/m, and particularly preferably in the range of 25 to 45 mN/m. Setting the surface tension in this range can reduce the curving in the droplet's trajectory during ink deposit. When the surface tension is less than 20 mN/m, the ink composition may asymmetrically adhere to the periphery of the nozzles holes when the ink composition is deposited because the wettability of the ink composition on the nozzle surfaces increases. In this case, since the ink composition is deposited with a nonuniform strength, a so-called curving in the trajectory of the droplet results, and the droplet does not land in the target position. The frequency at which the curving in the trajectory occurs naturally increases because a mutual attraction exists between the composition adhering to the nozzle hole and the composition about to be deposited. Also, if the surface tension exceeds 70 mN/m, it becomes difficult to control the deposit amount and timing of the ink composition because the shape of the meniscus at the tip of the nozzle becomes unstable.

The contact angle of the material with respect to the nozzle surface of the inkjet head from which the ink composition is deposited is preferably in the range of 30° to 170°, and particularly preferably in the range of 35° to 65°. When the ink composition has a contact angle in this range, the curving in the trajectory of the deposit of the ink composition can be controlled, and precise patterning is made possible. If the contact angle is less than 30°, a curving in the trajectory of the deposit occurs in the same manner as in the case where the surface tension of the deposit is not within the range of 20 to 70 mN/m, because the wettability of the ink composition with respect to the material constituting the nozzle surface increases. Also, when the contact angle exceeds 170°, it becomes difficult to control the deposit amount and the timing of the deposit because the mutual attraction between the ink composition and the nozzle hole becomes very small and the shape of the meniscus at the tip of the nozzle becomes unstable.

As used herein, the term "curving in the trajectory of deposit" refers to a situation in which the position of the landed ink composition that has been deposited from the nozzle is offset by 50 µm or more with respect to the target position. This mainly occurs when the wettability of the nozzle holes is non-uniform, or when clogging is cause due to adherence of the solid components in the ink composition.

The concentration of solids in the ink composition with respect to the entire composition is preferably in the range of 0.01 to 10.0 wt %, and more preferably in the range of 0.1 to 5.0 wt %. If the concentration of solids is too low, the number of times the ink composition needs to be deposited increases in order to obtain the required thickness, and the efficiency of the manufacturing process becomes less suitable for mass production. If the viscosity is too high, the suitability of the ink composition for depositing is compromised.

The solids are preferably dissolved or dispersed in at least one solvent at a vapor pressure of 0.005 to 50 mmHg at room temperature. By using a solvent that does not dry out easily, the ink composition can be prevented from unwanted drying, thickening, coagulating, and adherence of the ink in the nozzle holes can also be prevented.

However, a solvent of which the vapor pressure is below 0.005 mmHg is not suitable because it is difficult to remove the solvent in the film formation step.

Examples of such solvents include aprotic cyclic polar solvents such as γ-butyrolactone, N-methylpyrrolidone (NMP), 1,3-dimethyl-2-imidazolidinone (DMI), derivatives thereof, as well as glycol ether acetates such as carbitol acetate (CA), butyl carbitol acetate (BCA). Solvents such as CA and BCA are effective from the aspect of improving film formation characteristics. Conversely, lower alcohols such as methanol (MeOH), ethanol (EtOH), and propyl alcohol are effective for adjusting surface tension and viscosity, but they are highly volatile and should therefore be kept at 20 wt % or less.

Cathode Formation Step (S9)

Lastly, the process advances to the cathode (opposing electrode) formation step (S9).

In the cathode formation step (S9), a cathode 33 (counter electrode) is formed by vapor deposition, sputtering, CVD, or another method across the entire surface of the light-emitting layers (II) 32b and the bank portions (II) 31. The cathode 33 is formed in the present embodiment by laminating, for example, a calcium layer and an aluminum layer.

As a material for the cathode, metals with a small work function or alloys or metal oxides containing such metals, and the like are commonly used. Specific examples include alkali metals such as Li; alkali earth metals such as Mg, Ca; and rare earth metals such as Eu; and alloys of these metals with Al, Ag, or In. Also, in a configuration that uses an organic layer in which metal is doped on the boundary face between the cathode and the organic layer, the work function and other characteristics thereof are not particularly limited as long as the cathode is an electrically conductive material. Such configurations are shown in Japanese Patent Application Publications Nos. 10-270171 and 2001-102175.

In a similar fashion, where the organic layer in contact with the cathode comprises an organometallic complex compound containing at least one type of metal ion of an alkali metal ion, alkali earth metal ion, and a rare earth metal ion, it is possible to use metals that are capable of reducing the metal ions contained in the complex compound to a metal in a vacuum, heat reducing metals such as Al, Zr, Ti, or Si, or alloys containing these metals can be used as the cathode material. Such organometallic complex is disclosed in, for example, Japanese Patent Application Publications Nos. 11-233262 and 2000-182774.

Among these, aluminum, which is widely used in circuit electrodes, is particularly preferred from the aspect of ease of vapor deposition, high optical reflectivity, chemical stability, and other factors.

When forming an ITO film, damage-free sputtering can be conducted on the organic film. Damage-free sputtering uses a target-facing type sputtering device in which sputtering is conducted by placing an opposite electrode opposite the target with a predetermined space therebetween, and a reflective electrode around the edges of the target, such that magnetic fields that are partially parallel to the edges of the target are created in the vicinity of the edges of the target. Such damage-free sputtering method is described in detail in Japanese Patent Application Publication No. 2002-332567. When such damage-free sputtering is to be conducted, a transparent electrically conductive material such as ITO or IZO described above can be used as the cathode material, by using the metal-doped organic layer as the electron injection layer. Such metal-doped organic layer is described in detail in Japanese Laid-Open Patent Application No. 10-270171.

Through the above-describe process, transparent light-emitting elements where both the cathode and anode are transparent can be manufactured, because both the organic layer and the charge-generating layer are similarly transparent. It is also possible to construct a structure in which light is drawn from the film formation surface side rather than the substrate side by making the anode the metal electrode and the cathode the transparent electrode, which is the reverse of the configuration of the known organic EL element as described above.

Figure 13:
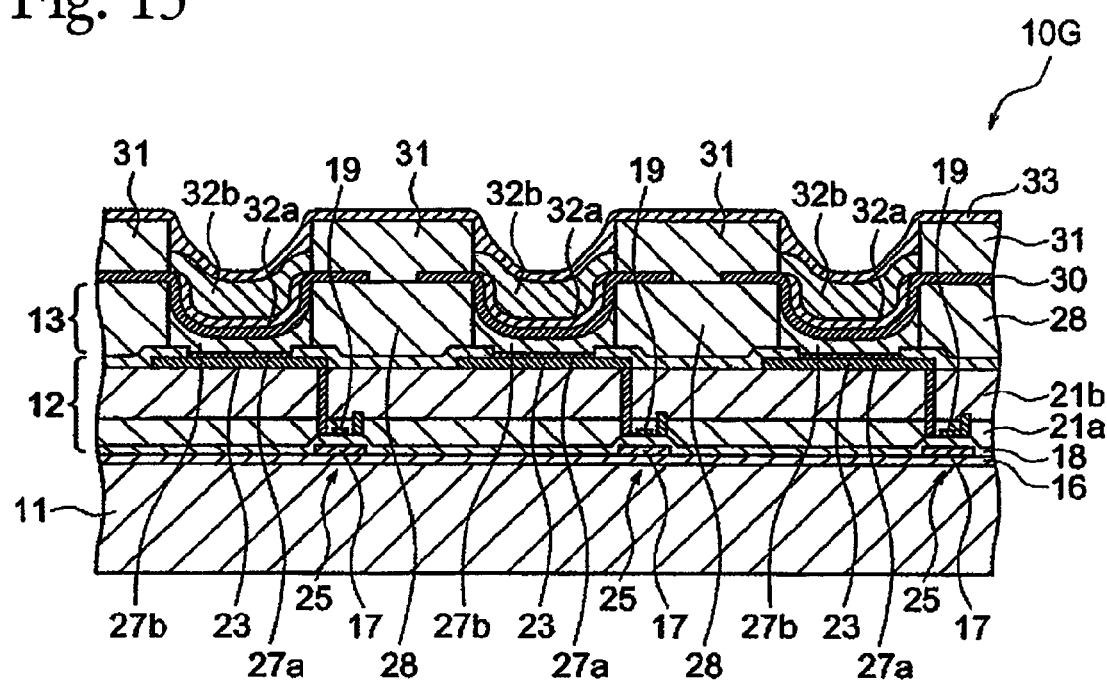
FIG. 13 is a cross-sectional view of the laminated organic EL element at a manufacturing step of the manufacturing method according to the embodiment of the present invention.

As described above, the cathode 33 is formed to obtain the substrate 10G as shown in FIG. 13.

The target two-layer laminated type organic EL element can thereafter be obtained by sealing the upper portion of the cathode 33 with a sealant (not shown), forming wiring, and performing other treatments.

In the present embodiment, film formation is started from the anode side, but film formation may alternatively begin from the cathode side.

The resulting laminated type organic EL element of the present embodiment is different from known organic EL elements in that it has a plurality of separate light-emitting positions. Therefore, it is possible to obtain the maximum light-emitting efficiency when the optical film thicknesses between each of the light-emitting positions and the light-reflecting electrodes are all substantially odd number multiples of ¼ wavelength ($\lambda \times (2n-1)/4$, where n is a natural number such as 1, 2, 3, ...).

Conversely, to avoid the necessity of this onerous strict film thickness adjustment, the cathode, which conventionally is the light-reflecting electrode, can be colored black as the non-reflecting electrode. In this case, the anode is the transparent electrode. Alternatively, at least one layer in the cathode direction, as viewed from the light-emitting layer, can be made to function as an optical absorption layer. Adopting such arrangements dispenses with the need to consider problems resulting from the optical interference effect. In this case, it will not be possible to make use of the reflected light, but at least it is possible to avoid the above-described offsetting phenomenon, which would be the worst-case situation. Conversely, when the light-reflecting electrode is an anode, either the anode itself or at least one layer in the anode direction may have the light absorbing function. Also, there should be theoretically no need to give consideration to problems that would be caused by optical interference if one of the electrode has a light-reflecting surface and the other electrode is the transparent electrode.

With the manufacturing method of the present invention, a laminated organic EL element having the following characteristics can be manufactured with a high production efficiency.

(i) In a conventional organic EL element, the upper limit of the quantum efficiency, which is the "ratio of photons (number) per second with respect to the electrons (number) per second as measured with an external circuit," is theoretically 1 (=100%). In the organic EL element shown in FIG. 1, however, there is no theoretical upper limit. In other words, the quantum efficiency of the laminated organic EL element is the sum of the quantum efficiency (which is the ratio of the number of electrons that apparently pass through the light-emitting unit each second and the number of photons that are discharged from the light-emitting units each second) of each of the light-emitting units partitioned by the charge-generating layer. This sum of quantum efficiencies does not have an upper limit.

(ii) In conventional organic EL element, the intensity of an organic EL element is substantially proportional to the density of the electric current, and a high current density is required to obtain high intensity. However, since the service life of the organic EL element is inversely proportional to the current density, high intensity light emission shortens the service life of the organic EL element. In contrast, in the laminated organic EL element obtained with the present invention, to increase the intensity to be obtained by n times with a certain desired current density, for example, the intensity of n times can be realized without increasing the current density by setting the number of light-emitting units to n units with the same configuration between the electrodes. Therefore, the service life of the organic EL element can be extended.

(iii) A conventional organic EL element is configured so that an increase in drive voltage directly leads to a decrease in the power conversion efficiency (W/W). However, the organic EL element shown FIG. 1 is configured so that the power conversion efficiency (W/W) does not change theoretically because the light emission start voltage is substantially n times the voltage that exists when an n number of light-emitting units is present between the electrodes. Therefore, the quantum efficiency is also increased n-fold.

(iv) In a conventional organic EL element, since there is only a single light-emitting unit, a short occurs between the cathode and anode due to the effect of a pinhole or other defect in the film that forms the light-emitting unit the organic EL element becomes an unusable non-illuminating element. In the organic EL element of the present invention shown in FIG. 1, however, it is possible to keep using the organic EL element even if a short occurs in one light-emitting unit as long as a short is not occurring in other light-emitting units.

2) Display Apparatus

The display apparatus of the present invention is provided with a laminated organic EL element obtained with the manufacturing method of the present invention.

In the display apparatus of the present invention, the position, size, and other parameters of the organic EL elements are not particularly limited, and it is possible to provided the elements in any position with the desired size.

Examples of the display apparatus of the present invention include televisions (large and midsize), displays for personal computers, PDAs (personal digital assistants), digital cameras, and displays for car navigation systems.

Also, the laminated organic EL element of the present invention is suitable for use as an electronic paper.

The display apparatus of the present invention is provided with a high quality laminated type organic EL element that is obtained with high production efficiency, and is therefore a low-cost display apparatus that has excellent durability, low power consumption, and excellent image display.

As used herein, the following directional terms "forward, rearward, above, downward, vertical, horizontal, below and transverse" as well as any other similar directional terms refer to those directions of a device equipped with the present invention. Accordingly, these terms, as utilized to describe the present invention should be interpreted relative to a device equipped with the present invention.

The term "configured" as used herein to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

This application claims priority to Japanese Patent Application No. 2004-059307. The entire disclosure of Japanese Patent Application No. 2004-059307 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A method of manufacturing a laminated type organic electroluminescent element that has a plurality of light-emitting units between a cathode and an anode, the light-emitting units being partitioned by at least one charge-generating layer, the method comprising steps of:
   providing one of the cathode and the anode;
   providing a first layer of a bank portion so as to have an aperture corresponding to the one of the cathode and the anode;

providing a first layer of the light-emitting units in the aperture;

depositing a liquid material for forming the charge-generating layer onto a predetermined position above the first layer of the light-emitting units and the first layer of the bank portion, the charge-generating layer being formed using a depositing device;

providing a second layer of the bank portion onto a prescribed portion above the first layer of the bank portion and the charge-generating layer so that the charge-generating layer is at least partially interposed between the first and second layers of the bank portion; and providing the other of the anode and the cathode.

2. The method of manufacturing a laminated type organic electroluminescent element according to claim 1, wherein the charge-generating layer has an electrical resistivity of $1.0 \times 10^2$ Ω·cm or higher.

3. The method of manufacturing a laminated type organic electroluminescent element according to claim 1, wherein the charge-generating layer has a transmittance rate of visible light that is 50% or higher.

4. The method of manufacturing a laminated type organic electroluminescent element according to claim 1, wherein the charge-generating layer includes a laminated or mixed layer of two different types of substances with a charge-transfer complex composed of a radical cation and a radical anion being produced by an oxidation-reduction reaction between the two types of substances.

5. The method of manufacturing a laminated type organic electroluminescent element according to claim 1, wherein the charge-generating layer includes a laminated or mixed layer of a component (a) an organic compound having an ionization potential that is smaller than 5.7 eV and electron-donating characteristics, and a component (b) at least one of an inorganic compound and an organic compound, the component (b) being capable of forming a charge-transfer complex by an oxidation-reduction reaction with the organic compound (a), with a charge-transfer complex being formed by an oxidation-reduction reaction between the component (a) and the component (b).

6. The method of manufacturing a laminated type organic electroluminescent element according to claim 5, wherein the component (b) includes a metal oxide as an inorganic component.

7. The method of manufacturing a laminated type organic electroluminescent element according to claim 5, wherein the component (b) includes a metal halide as an inorganic component.

8. The method of manufacturing a laminated type organic electroluminescent element according to claim 5, wherein the component (b) has an organic compound that has at least one fluorine atom as a substituent and an electron-accepting characteristic.

9. The method of manufacturing a laminated type organic electroluminescent element according to claim 5, wherein the component (b) has an organic compound that has at least one cyano group as a substituent and an electron-accepting characteristic.

10. The method of manufacturing a laminated type organic electroluminescent element according to claim 5, wherein the component (a) is an arylamine compound shown in the following formula (I):

(I)

wherein $Ar_1$, $Ar_2$, and $Ar_3$ are aromatic hydrocarbons.

11. The method of manufacturing a laminated type organic electroluminescent element according to claim 1, wherein the light-emitting units are formed using a depositing device.

12. The method of manufacturing a laminated type organic electroluminescent element according to claim 1, wherein each of the light-emitting units includes a hole injection/transport layer and a light-emitting layer, and at least one of the hole injection/transport layers and the light-emitting layers are formed using a depositing device.

13. A display apparatus comprising the laminated type organic electroluminescent element obtained with the manufacturing method according to claim 1.

14. The method of manufacturing a laminated type organic electroluminescent element according to claim 1, further comprising providing a second layer of the light-emitting units on the charge-generating layer before the providing of the other of the anode and the cathode.

* * * * *